United States Patent
Tak et al.

(10) Patent No.: US 12,001,683 B2
(45) Date of Patent: Jun. 4, 2024

(54) MEMORY DEVICE, MEMORY SYSTEM INCLUDING THE SAME, AND OPERATING METHOD OF THE MEMORY SYSTEM

(71) Applicant: SAMSUNG ELECTRONICS CO., LTD., Suwon-si (KR)

(72) Inventors: Heeyeon Tak, Suwon-si (KR); Hyunseon Park, Suwon-si (KR); Heehyun Nam, Suwon-si (KR); Sumin Ahn, Suwon-si (KR); Wansoo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/087,464

(22) Filed: Dec. 22, 2022

(65) Prior Publication Data

US 2023/0205423 A1 Jun. 29, 2023

(30) Foreign Application Priority Data

Dec. 28, 2021 (KR) .......................... 10-2021-0190397
Apr. 12, 2022 (KR) .......................... 10-2022-0045272

(51) Int. Cl.
*G06F 3/06* (2006.01)

(52) U.S. Cl.
CPC .......... *G06F 3/0613* (2013.01); *G06F 3/0656* (2013.01); *G06F 3/0679* (2013.01)

(58) Field of Classification Search
CPC ..... G06F 3/0613; G06F 3/0656; G06F 3/0679
See application file for complete search history.

(56) References Cited

U.S. PATENT DOCUMENTS

| | | |
|---|---|---|
| 7,061,813 B2 | 6/2006 | Lee |
| 9,847,122 B2 | 12/2017 | Choi et al. |
| 10,490,285 B2 | 11/2019 | Yoon et al. |
| 10,957,384 B1 | 3/2021 | Hung et al. |
| 11,056,162 B2 | 7/2021 | Yoon et al. |
| 11,309,043 B2 | 4/2022 | Choi |

(Continued)

FOREIGN PATENT DOCUMENTS

| | | |
|---|---|---|
| KR | 10-2006-0006332 A | 1/2006 |
| KR | 10-2014-0142960 A | 12/2014 |

(Continued)

OTHER PUBLICATIONS

Communication dated Jul. 11, 2023, issued by the European Intellectual Property Office in European Patent Application No. 22214104.6.

(Continued)

*Primary Examiner* — William E. Baughman
(74) *Attorney, Agent, or Firm* — Sughrue Mion, PLLC

(57) ABSTRACT

A memory system includes a memory device including a memory cell array, a first latch, a plurality of program latches, and a second latch and a memory controller configured to provide a command to the memory device. The memory device may sense first data from a first region of the memory cell array, store the sensed first data in the first latch, transfer the sensed first data to the second latch, output the first data from the second latch to the memory controller, and transfer the first data from the second latch to a first program latch of the plurality of program latches, in response to a first read command.

20 Claims, 18 Drawing Sheets

(56) References Cited

U.S. PATENT DOCUMENTS

| | | | |
|---|---|---|---|
| 11,531,494 B2 | 12/2022 | Shin | |
| 2013/0141972 A1* | 6/2013 | Yoon | G11C 14/0018 |
| | | | 365/185.18 |
| 2017/0011799 A1* | 1/2017 | Lee | G11C 16/10 |
| 2017/0256309 A1* | 9/2017 | Yoon | G11C 16/24 |
| 2018/0075917 A1* | 3/2018 | Utsunomiya | G11C 16/3459 |
| 2020/0258577 A1 | 8/2020 | Lee et al. | |
| 2021/0286524 A1 | 9/2021 | Kojima et al. | |
| 2022/0342817 A1* | 10/2022 | Park | G06F 12/0802 |

FOREIGN PATENT DOCUMENTS

| | | |
|---|---|---|
| KR | 10-2174030 B1 | 11/2020 |
| KR | 10-2021-0068902 A | 6/2021 |
| KR | 10-2021-0077451 A | 6/2021 |
| KR | 10-2021-0155660 A | 12/2021 |

OTHER PUBLICATIONS

Communication dated Dec. 29, 2022, issued by the Korean Intellectual Property Office in Korean Patent Application No. 10-2022-0045272.

* cited by examiner

| LATCH NUMBER | PA |
|---|---|
| 1 (M_LAT) | PA1 |
| 2 (L_LAT) | PA2 |
| 3 (F_LAT) | PA3 |

| LATCH NUMBER | PA | ECC |
|---|---|---|
| 1 (M_LAT) | PA1 | OFF |
| 2 (L_LAT) | PA2 | ON |
| 3 (F_LAT) | PA3 | OFF |

MEMORY DEVICE, MEMORY SYSTEM INCLUDING THE SAME, AND OPERATING METHOD OF THE MEMORY SYSTEM

CROSS-REFERENCE TO RELATED APPLICATIONS

This application is based on and claims priority under 35 U.S.C. § 119 to Korean Patent Application No. 10-2021-0190397, filed on Dec. 28, 2021, and Korean Patent Application No. 10-2022-0045272, filed on Apr. 12, 2022, in the Korean Intellectual Property Office, the disclosures of which are incorporated by reference herein in their entireties.

BACKGROUND

The present disclosure relates to a memory system, and more particularly, to a memory system, which performs a read operation by using a latch of a page buffer.

Storage mediums, such as a solid state drive (SSD), may include a memory controller and a non-volatile memory. Based on a request of a host, the memory controller may write data in the non-volatile memory, or may read data from a memory device.

As a number of times the non-volatile memory is accessed is reduced, a response time provided to the host may slow. Therefore, the memory controller may use a portion of the non-volatile memory (for example, static random access memory (SRAM)) to improve a response time. That is, the memory controller may store data in a portion of the non-volatile memory such as SRAM, and when a request of the host is received, the memory controller may not access a memory cell array of the non-volatile memory and may provide the host with data read from the portion of the non-volatile memory (for example, SRAM). However, in a case where the non-volatile memory is separately provided, the cost of a memory system may increase, and the size of memory system may increase.

SUMMARY

Example embodiments provide a memory device, which provides data corresponding to a read command by using an idle latch of a page buffer when performing a read operation, a memory system including the memory device, and an operating method of the memory system.

According to an aspect of an example embodiment, a memory system includes: a memory device including: a memory cell array connected to a plurality of bit lines; a first latch configured to sense data stored in the memory cell array; a plurality of program latches configured to store data which is to be programmed in the memory cell array, or data which determines a voltage level pre-charged in the plurality of bit lines in performing a program operation; and a second latch configured to receive data which is to be programmed in the memory cell array, or output data sensed from the memory cell array; and a memory controller configured to provide a command to the memory device, wherein the memory device is configured to: sense first data from a first region of the memory cell array, store the first data in the first latch, transfer the first data from the first latch to the second latch, output the first data from the second latch to the memory controller, and in response to a first read command, transfer the first data from the second latch to a first program latch of the plurality of program latches.

According to an aspect of an example embodiment, an operating method of a memory system including a memory device including a memory cell array and a plurality of latches and a memory controller controlling the memory device, the operating method including: selecting, by the memory controller, a first latch from among the plurality of latches; providing, by the memory controller, the memory device with a first physical address and a first read command including identification information about the first latch; providing, by the memory device, the memory controller with data sensed from a region corresponding to the first physical address in the memory cell array in response to the first read command; and storing, by the memory device, the data in the first latch.

According to an aspect of an example embodiment, a memory device includes a memory cell array connected to a plurality of bit lines; a first latch configured to sense data stored in the memory cell array; a second latch configured to store data which is to be programmed in the memory cell array, or data determining a voltage level pre-charged in the plurality of bit lines in performing a program operation; and a third latch configured to: receive data which is to be programmed in the memory cell array, or output data sensed from the memory cell array, wherein, in response to a first read command corresponding to a first region of the memory cell array, the first latch is configured to sense first data from the first region and transfer the sensed first data to the third latch, and the third latch is configured to output the first data to a memory controller and transfer the first data to the second latch.

BRIEF DESCRIPTION OF THE DRAWINGS

The above and/or other aspects will be more clearly understood from the following detailed description in conjunction with the accompanying drawings in which.

DETAILED DESCRIPTION

Hereinafter, various embodiments will be described with reference to the accompanying drawings.

Figure 1:
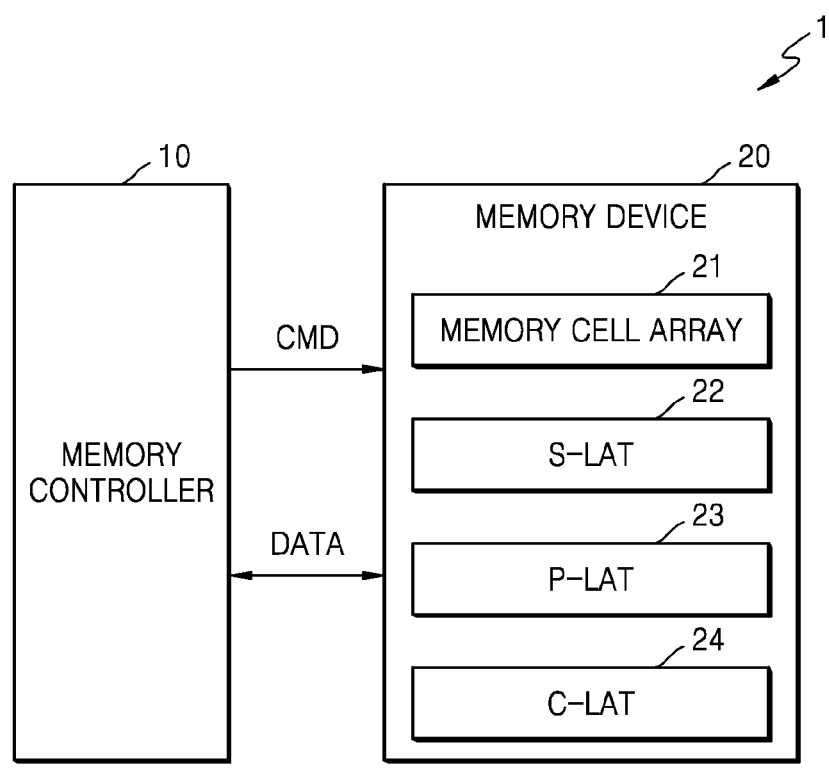
FIG. 1 is a diagram for describing a memory system according to an example embodiment.

FIG. 1 is a diagram for describing a memory system 1 according to an example embodiment.

Referring to FIG. 1, the memory system 1 may include a memory controller 10 and a memory device 20. The memory system 1 may include at least one of a solid state drive (SSD), an embedded memory, and a detachably attached external memory. When the memory system 1 is an SSD, the memory system 1 may be a device conforming with the non-volatile memory express (NVMe) standard. When the memory system 1 is an embedded memory or an external memory, the memory system 1 may be a device conforming with the universal flash storage (UFS) or embedded multimedia card (eMMC) standard.

The memory device 20 may include a memory cell array 21, a sensing latch 22, a program latch 23, and a cache latch 24. The memory cell array 21 may include a two-dimensional (2D) NAND memory array or a three-dimensional (3D) NAND memory array. The memory device 20 may include various kinds of memory devices. For example, the memory device 20 may use magnetic random access memory (RAM) (MRAM), spin-transfer torque MRAM, conductive bridging RAM (CBRAM), ferroelectric RAM (FeRAM), phase RAM (PRAM), resistive RAM (ReRAM), and various kinds of memories.

The memory controller 10 may provide a command CMD to the memory device 20 and may transfer/receive data to/from the memory device 20. For example, the memory controller 10 may provide a read command to the memory device 20 and may receive, from the memory device 20, data corresponding to the read command. Alternatively, the memory controller 10 may provide a program command and data to the memory device 20 and may store the data in the memory device 20.

When the memory device 20 receives the read command, a sensing operation of sensing data stored in the memory cell array 21 by using the sensing latch 22 may be performed. In detail, the memory device 20 may be provided with a physical address from the memory controller 10, and the sensing latch 22 may sense data of a page corresponding to the physical address among pages included in the memory cell array 21. Also, the data sensed by the sensing latch 22 may be transferred to the cache latch 24, and the data transferred to the cache latch 24 may be output to the memory controller 10. In some embodiments, data sensing, data transfer, and data output may be controlled by two or more commands. In some embodiments, data sensing, data transfer, and data output may be controlled by one command.

When the memory device 20 receives the program command, data provided from the memory controller 10 may be stored in the cache latch 24, and data stored in the cache latch 24 may be transferred to the program latch 23. The data stored in the program latch 23 may be programmed in the memory cell array 21.

According to an example embodiment, data may be output from the cache latch 24 to the memory controller 10 on the basis of the read command, and then, the data of the cache latch 24 may be transferred to the program latch 23. An operation of transferring the data of the cache latch 24 to the program latch 23 may be referred to as a dump-up operation. When the read command is again received based on the same physical address, an operation of sensing data in the memory cell array 21 may be omitted, and the data stored in the program latch 23 may be transferred to the cache latch 24. An operation of transferring the data of the program latch 23 to the cache latch 24 may be referred to as a dump-down operation. Data dumped down to the cache latch 24 may be provided to the memory controller 10.

A time for which data is sensed by the sensing latch 22 in the memory cell array 21 may occupy a large portion of a read operation time. Therefore, when a repetitive read operation is performed based on the same physical address, the memory system 1 according to an embodiment may omit a sensing operation through a dump-up operation and a dump-down operation, thereby providing a shortened read time.

Figure 2:
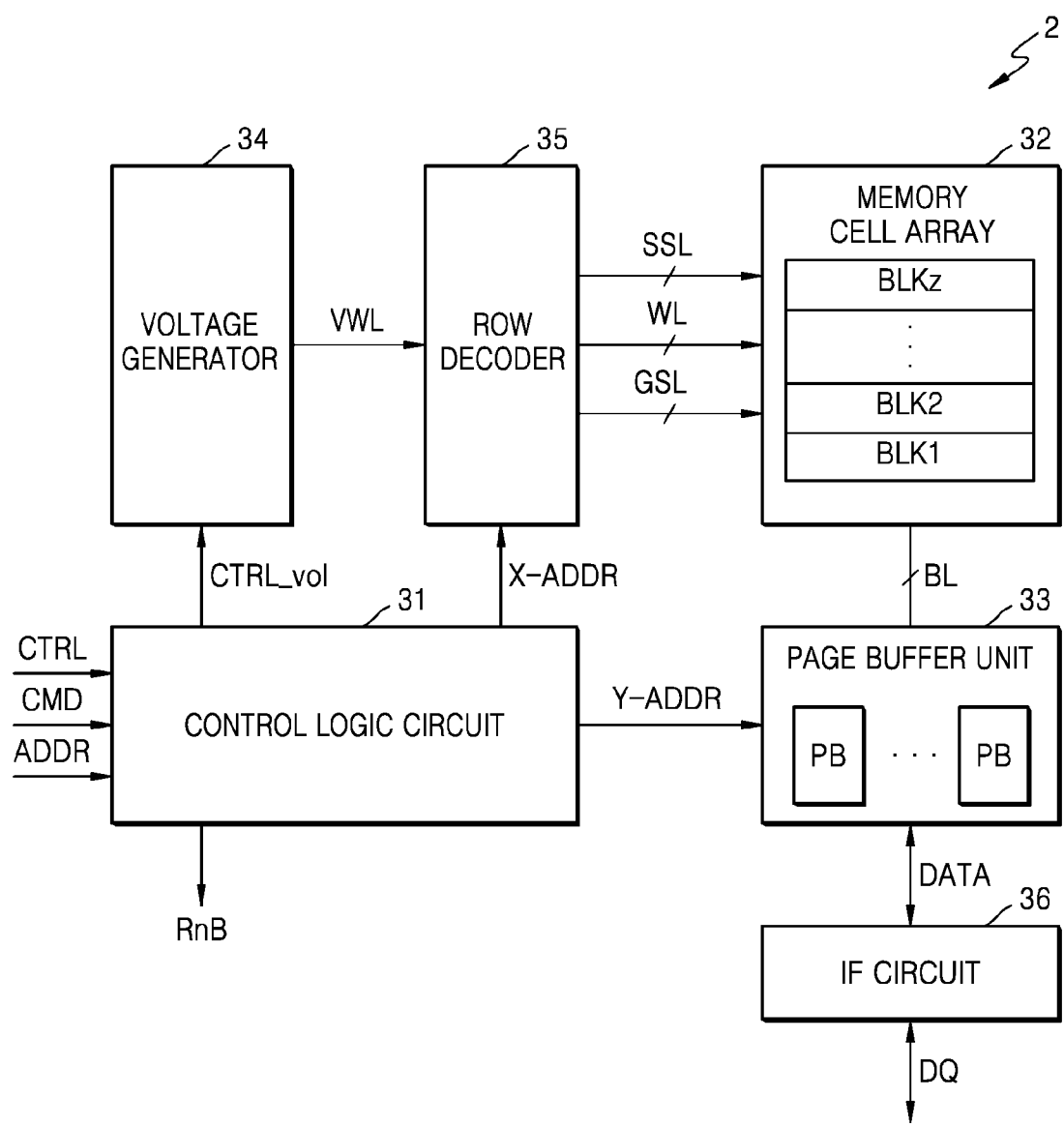
FIG. 2 is a block diagram illustrating a memory device according to an example embodiment.

FIG. 2 is a block diagram illustrating a memory device 2 according to an example embodiment. Referring to FIG. 2, the memory device 2 may include a control logic circuit 31, a memory cell array 32, a page buffer circuit 33, a voltage generator 34, a row decoder 35, and an interface circuit 36. Although not shown in FIG. 2, the memory device 2 may further include a column logic, a pre-decoder, a temperature sensor, a command decoder, and an address decoder. The memory device 2 may be an embodiment of the memory device 20 of FIG. 1.

The control logic circuit 31 may overall control various operations of the memory device 2. The control logic circuit 31 may output various control signals in response to a command CMD and/or an address ADDR from the interface circuit 36. For example, the control logic circuit 31 may output a voltage control signal CTRL_vol, a row address X-ADDR, and a column address Y-ADDR.

The memory cell array 32 may include a plurality of memory blocks BLK1 to BLKz (where z is a positive integer), and each of the plurality of memory blocks BLK1 to BLKz may include a plurality of memory cells. The memory cell array 32 may be connected to the page buffer circuit 33 through bit lines BL and may be connected to the row decoder 35 through word lines WL, string selection lines SSL, and ground selection lines GSL. The memory cell array 32 may be an embodiment of the memory cell array 21 of FIG. 1. Memory cells connected to one word line WL may be referred to as a page.

In an example embodiment, the memory cell array 32 may include a three-dimensional (3D) memory cell array, and the 3D memory cell array may include a plurality of NAND strings. Each of the NAND strings may include memory cells respectively connected to word lines, which are vertically stacked on a substrate. U.S. Pat. Nos. 7,679,133, 8,553,466, 8,654,587 and 8,559,235 and U.S. Patent Application No. 2011/0233648 may be incorporated herein in their entirety by reference. In an example embodiment, the memory cell array 32 may include a two-dimensional (2D) memory cell array, and the 2D memory cell array may include a plurality of NAND strings which are arranged in a row and column direction.

The page buffer circuit 33 may include a plurality of page buffers PB (where n is an integer of 3 or more), and the plurality of page buffers PB may be respectively connected to memory cells through a plurality of bit lines BL. The page buffer circuit 33 may select at least one bit line from among bit lines BL in response to the column address Y-ADDR. The page buffer circuit 33 may operate as a write driver or a sense amplifier on the basis of an operation mode. For example, when performing a program operation, the page buffer circuit 33 may apply a bit line voltage, corresponding to data which is to be programmed, to the selected bit line. When performing a read operation, the page buffer circuit 33 may sense a current or a voltage of the selected bit line to sense data stored in a memory cell. Although not shown, each of the page buffers PB may include a plurality of latches (for example, 22, 23, and 24 of FIG. 1).

The voltage generator 34 may generate various kinds of voltages for performing program, read, and erase operations on the basis of the voltage control signal CTRL_vol. For example, the voltage generator 34 may generate a program voltage, a read voltage, a program verify voltage, and an erase voltage as a word line voltage VWL.

In response to the row address X-ADDR, the row decoder 35 may select one word line WL from among a plurality of word lines WL and may select one string selection line SSL from among a plurality of string selection lines SSL. For example, when performing the program operation, the row decoder 35 may apply the program voltage and the program verify voltage to the selected word line, and in performing the read operation, the row decoder 35 may apply the read voltage to the selected word line.

Figure 3:
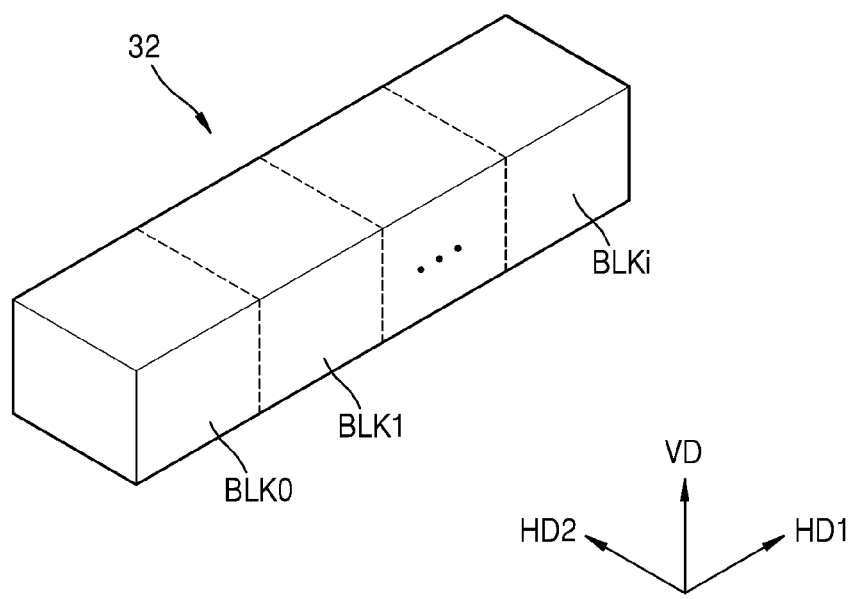
FIG. 3 illustrates a memory cell array of FIG. 2, according to an example embodiment.

FIG. 3 illustrates the memory cell array 32 of FIG. 2, according to an example embodiment.

Referring to FIG. 3, the memory cell array 32 may include a plurality of memory blocks BLK0 to BLKi, in which i may be a positive integer. Each of the plurality of memory blocks BLK0 to BLKi may have a 3D structure (or a vertical structure). In detail, each of the plurality of memory blocks BLK0 to BLKi may include a plurality of NAND strings extending in a vertical direction VD. In this case, the plurality of NAND strings may be provided apart from one another in first and second horizontal directions HD1 and HD2. The plurality of memory blocks BLK0 to BLKi may be selected by a row decoder (35 of FIG. 2). For example, the row decoder 35 may select a memory block corresponding to a block address from among the plurality of memory blocks BLK0 to BLKi.

Figure 4:
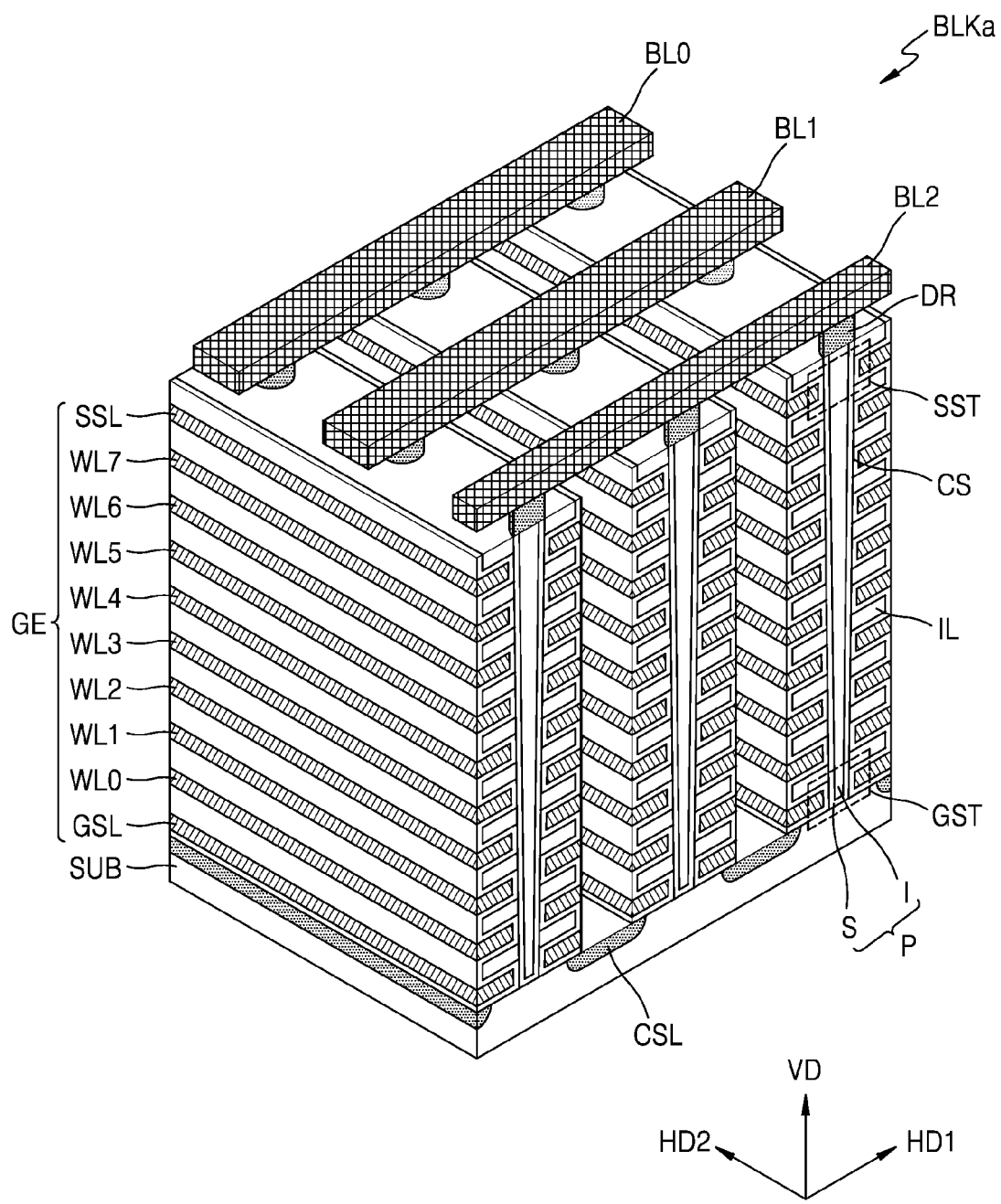
FIG. 4 is a perspective view illustrating a memory block of FIG. 3, according to an example embodiment.

FIG. 4 is a perspective view illustrating the memory block of FIG. 3, according to an example embodiment.

A memory block BLKa may be an embodiment of the memory blocks BLK0, BLK1, and BLKi of FIG. 3. Referring to FIG. 4, the memory block BLKa may be formed in a vertical direction with respect to a substrate SUB. The substrate SUB may be of a first conductive type (for example, p type), and a common source line CSL, which extends in a second horizontal direction HD2 and is doped with impurities of a second conductive type (for example, n type), may be provided on the substrate SUB. A plurality of insulation layers IL extending in the second horizontal direction HD2 may be sequentially provided in a region of the substrate SUB between two adjacent common source lines CSL and may be apart from one another by a certain distance in a vertical direction VD. For example, the plurality of insulation layers IL may include an insulating material, such as silicon oxide.

A plurality of pillars P, which are sequentially arranged in a first horizontal direction HD1 and pass through the plurality of insulation layers IL in the vertical direction VD, may be provided in a region of the substrate SUB between two adjacent common source lines CSL. For example, the plurality of pillars P may pass through the plurality of insulation layers IL and may contact the substrate SUB. In detail, a surface layer S of each of the pillars P may include a silicon material having a first type and may function as a channel region. Furthermore, an inner layer I of each pillar P may include an air gap or an insulating material, such as silicon oxide. See the portion indicated GST (phase change material) in FIG. 4.

A charge storage layer CS may be provided along the insulation layers IL, the pillars P, and an exposed surface of the substrate SUB in a region of the substrate SUB between two adjacent common source lines CSL. The charge storage layer CS may include a gate insulation layer (or a tunneling insulation layer), a charge trap layer, and a blocking insulation layer. For example, the charge storage layer CS may have an oxide-nitride-oxide (ONO) structure. Also, a gate electrode GE, such as word lines WL0 to WL7 and selection lines GSL and SSL, may be provided on an exposed surface of the charge storage layer CS in a region of the substrate SUB between two adjacent common source lines CSL.

Drains or drain contacts DR may be respectively provided on the plurality of pillars P. For example, the drains or drain contacts DR may include a silicon material doped with impurities having the second conductive type. Bit lines BL1 to BL3, which extend in the first horizontal direction HD1 and are apart from one another by a certain distance in the second horizontal direction HD2, may be provided on the drains DR.

Figure 5:
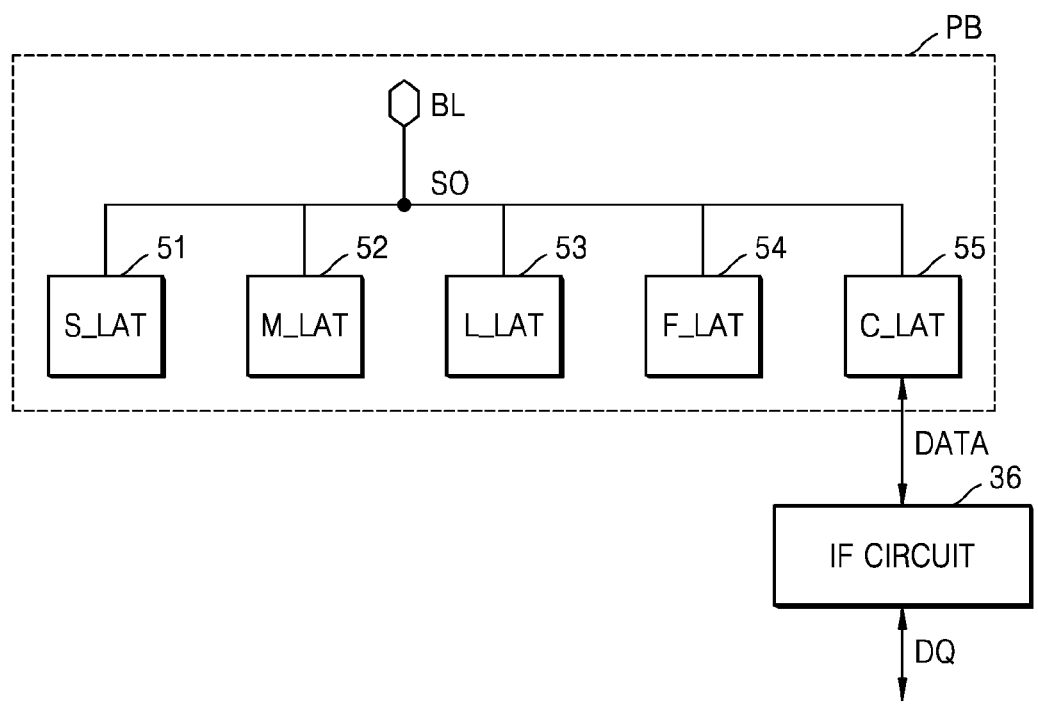
FIG. 5 is a block diagram illustrating a page buffer PB according to an example embodiment.

FIG. 5 is a block diagram illustrating a page buffer PB according to an example embodiment.

Referring to FIG. 5, the page buffer PB may be an embodiment of the page buffer PB of FIG. 2. The page buffer PB may transfer or receive data to or from an interface circuit 36. The page buffer PB may be connected to a bit line BL through a sensing node SO. The page buffer PB may include a sensing latch 51, an upper bit latch 52, a lower bit latch 53, a force latch 54, and a cache latch 55, which are connected to the sensing node SO. The upper bit latch 52, the lower bit latch 53, or the force latch 54 may be referred to as a program latch (for example, 23 of FIG. 1). According to an embodiment, the sensing latch 51, the upper bit latch 52, the lower bit latch 53, or the force latch 54 may be referred to as a main latch. Although not shown, the page buffer PB may further include a pre-charge circuit, which controls a pre-charge operation on the bit line BL or the sensing node SO.

The sensing latch 51 may store data stored in a memory cell or a sensing result of a threshold voltage of the memory cell, in performing a read or program verify operation. Also, the sensing latch 51 may be used to apply a program bit line voltage or a program inhibit voltage to the bit line BL in performing a program operation. The upper bit latch 52, the lower bit latch 53, or the cache latch 55 may be used to store data input from the outside in performing the program operation. For example, in a case where 3-bit data is programmed in one memory cell, the 3-bit data may be stored in each of the upper bit latch 52, the lower bit latch 53, and the cache latch 55. Also, in performing the read operation, the cache latch 55 may receive data, read from a memory cell, from the sensing latch 51 and may output the received data to the outside through a data input/output line. The force latch 54 may be used to improve a threshold voltage distribution in performing the program operation. In detail, the force latch 54 may be used to determine a pre-charge level of the bit line BL in performing the program operation. For example, based on data stored in the force latch 54, the bit line BL may be pre-charged at a program inhibit voltage level, a program allowable voltage level, or a middle level between the program inhibit voltage level and the program allowable voltage level.

Figure 6:
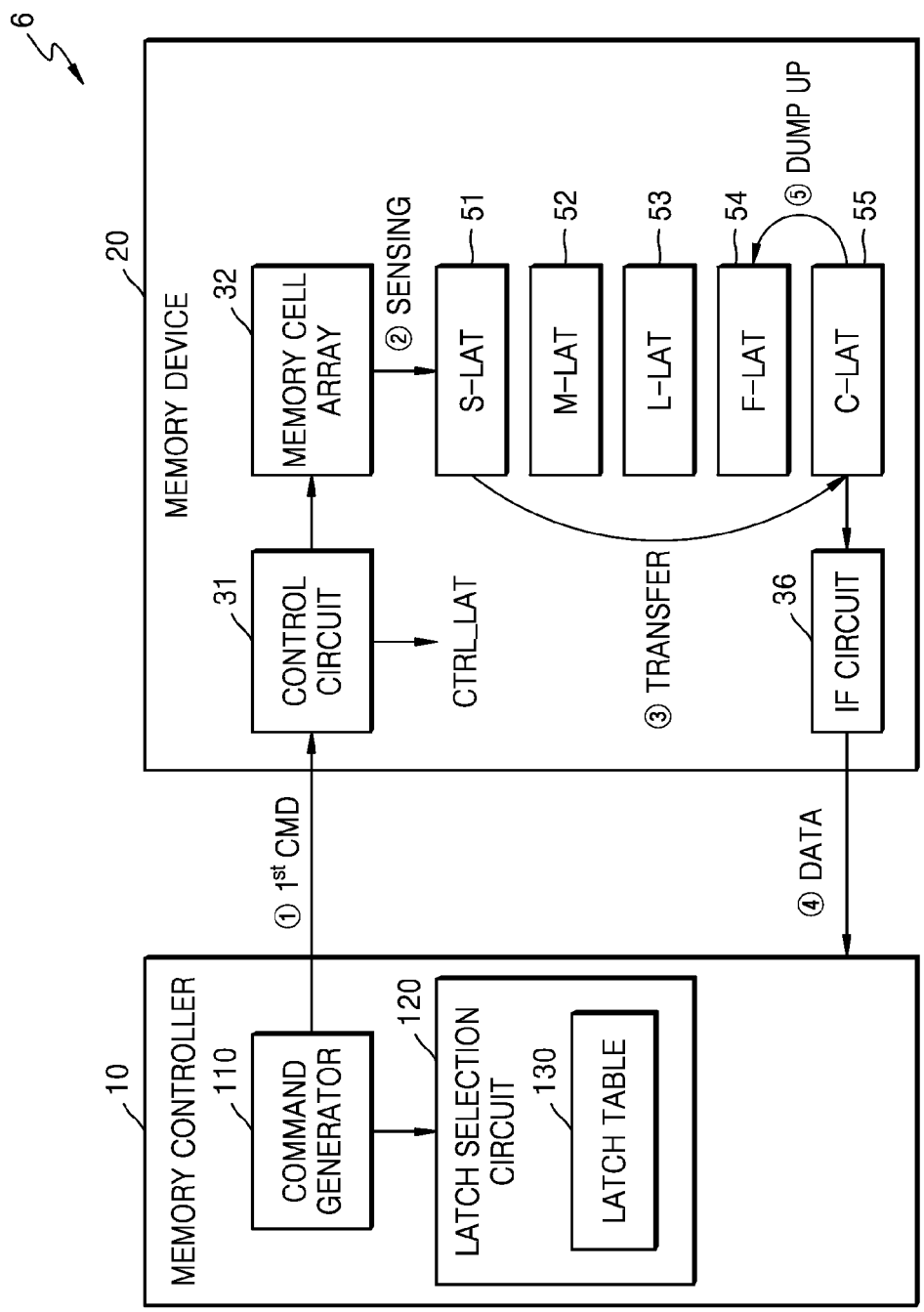
FIG. 6 is a block diagram describing a memory system performing a dump-up operation, according to an example embodiment.
Figure 7:
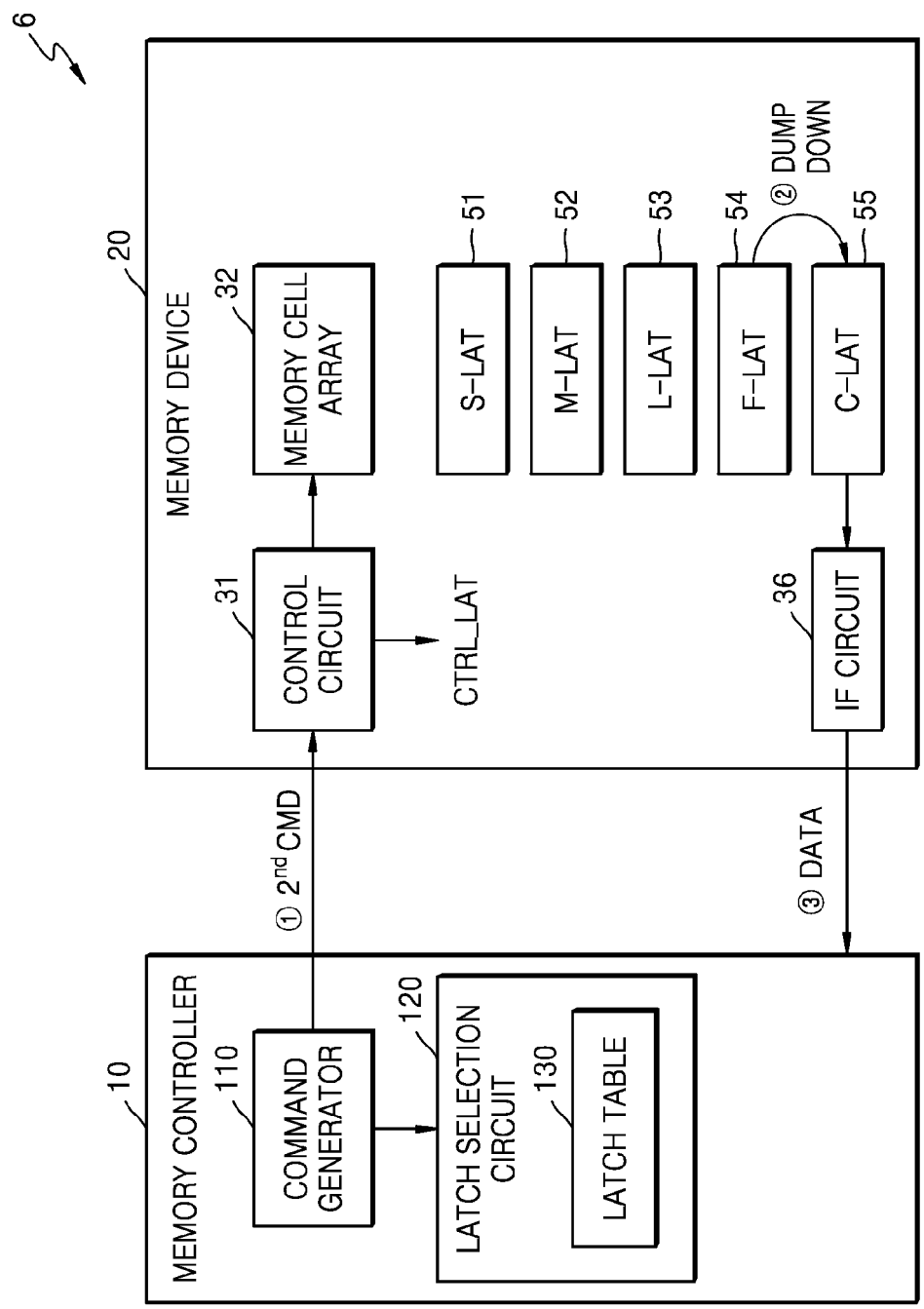
FIG. 7 is a block diagram describing a memory system performing a dump-down operation, according to an example embodiment.
Figure 8:
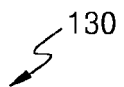
FIG. 8 is a diagram describing a latch table according to an example embodiment.

FIG. 6 is a block diagram describing a memory system performing a dump-up operation, according to an example embodiment. FIG. 7 is a block diagram describing a memory system performing a dump-down operation, according to an example embodiment. FIG. 8 is a diagram describing a latch table according to an example embodiment.

Referring to FIG. 6, a memory system 6 may include a memory controller 10 and a memory device 20.

The memory controller 10 may include a command generator 110 and a latch selection circuit 120.

The command generator 110 may generate commands transferred to the memory device 20. In some embodiments, the command generator 110 may include a command queue which stores a command.

The latch selection circuit 120 may select a target latch, which is to be dumped up, of program latches 52 to 54 included in the memory device 20 and may provide an identification number of the selected latch to the command generator 110. The target latch may be selected based on a cache algorithm. For example, the latch selection circuit 120 may select a target latch on the basis of a least recently used (LRU) algorithm, a first in first out (FIFO) algorithm, a least frequently used (LFU) algorithm, a most frequently used (MFU) algorithm, or a not used recently (NUR) algorithm.

The latch selection circuit 120 may update a latch table 130.

Referring to FIG. 8, the latch table 130 may store a physical address and an identification number of a latch. The identification number of the latch may represent the upper bit latch 52, the lower bit latch 53, or the force latch 54 included in the memory device 20. The physical address may represent a physical address of a storage region of the memory cell array 32 where dumped-up data is stored in each latch. That is, FIG. 8 represents a state where data of a storage region corresponding to a physical address PA1 is stored in the upper bit latch 52 and a state where data of a storage region corresponding to a physical address PA2 is stored in the lower bit latch 53.

Referring again to FIG. 6, the latch selection circuit 120 may select a target latch as the force latch 54 on the basis of the cache algorithm.

The command generator 110 may transfer a first command (1$^{st}$ CMD) to the memory device 120 (①) The first command (1$^{st}$ CMD) may be a read command. The first command (1$^{st}$ CMD) may include an identification number of the force latch 54. Referring to FIG. 8, the identification number of the force latch 54 may be 3. Also, a physical address of a storage region (for example, a page) read based on a command from among pages included in the memory cell array 32 may be PA3.

The control circuit 31 may sense, using the sensing latch 51, data of a page corresponding to the physical address PA3 in response to the first command (1$^{st}$ CMD). A time taken until data of a page corresponding to PA3 is stored in the sensing latch 51 may be referred to as a sensing time tR. The control circuit 31 may output a latch control signal CTRL_LAT to control the latches (51 to 55).

Data stored in the sensing latch 51 may be transferred to the cache latch 55, and the data transferred to the cache latch 55 may be transferred to the interface circuit 36 (③).

The interface circuit 36 may output data to the memory controller 10 (④). In some embodiments, the transfer of data and an output of data may be performed in response to a command which differs from the first command (1$^{st}$ CMD). A time taken until data stored in the sensing latch 51 is transferred to the cache latch 55 and the data transferred to the cache latch 55 is transferred to the memory controller 10 may be referred to as a data output time tDOUT.

The data stored in the cache latch 55 may be dumped up to the force latch 54 (C). That is, the control circuit 31 may transfer the data of the cache latch 55 to the force latch 54 on the basis of an identification number of the force latch 54 included in the first command (1$^{st}$ CMD). The content of the force latch 54 may be indicated as shown in FIG. 8. FIG. 8 represents a state where data of a page corresponding to the physical address PA3 is stored in the force latch 54. A time taken until the data stored in the cache latch 55 is transferred to the force latch 54 may be referred to as a dump-up time tDUP. In some embodiments, a data dump-up operation may be performed in response to a command which differs from the first command (1$^{st}$ CMD).

Referring to FIG. 7, the command generator 110 may transfer a second command (2$^{nd}$ CMD), corresponding to the physical address PA3, to the memory device 20 (①) The second command (2$^{nd}$ CMD) may be a read command. The second command (2$^{nd}$ CMD) may include an identification number of the force latch 54. The control circuit 31 may generate the latch control signal CTRL_LAT on the basis of the second command (2$^{nd}$ CMD) to control the latches 51 to 55.

The data stored in the force latch 54 may be dumped down to the cache latch 55 (②). A time taken until the data stored in the force latch 54 is dumped down to the cache latch 55 may be referred to as a dump-down time tDDOWN. The data dumped down to the cache latch 55 may be transferred to the interface circuit 36, and the interface circuit 36 may output the data to the memory controller 10 (③).

Referring to FIG. 7, an operation of sensing data stored in the memory cell array 32 by using the sensing latch 51 may be omitted, and thus, a read time may be shortened.

An embodiment where a read time is shortened in performing a read operation on the physical address PA3 is disclosed, but embodiments are not limited thereto. As illustrated in FIG. 8, when a read command corresponding to a physical address PA1 is transferred to the memory device 20, data stored in the upper bit latch 52 may be dumped down to the cache latch 55. When a read command corresponding to a physical address PA2 is transferred to the memory device 20, data stored in the lower bit latch 53 may be dumped down to the cache latch 55. As illustrated in FIG. 8, in a case where physical addresses are respectively allocated to all latches, the latch selection circuit 120 may remove a physical address allocated to a selected latch on the basis of a cache algorithm and may allocate a new physical address to the selected latch.

The program latches 52 to 54 may be used in performing a program operation, and thus, may be in an idle state in performing a read operation. Therefore, according to embodiments, under a condition where a read operation is continuously performed, a read time may be shortened by using program latches.

According to an embodiment, the memory controller 10 may select a latch on the basis of the cache algorithm and may provide an identification number of a selected latch to the memory device 20, thereby controlling a dump-up operation and a dump-down operation.

Figure 9:
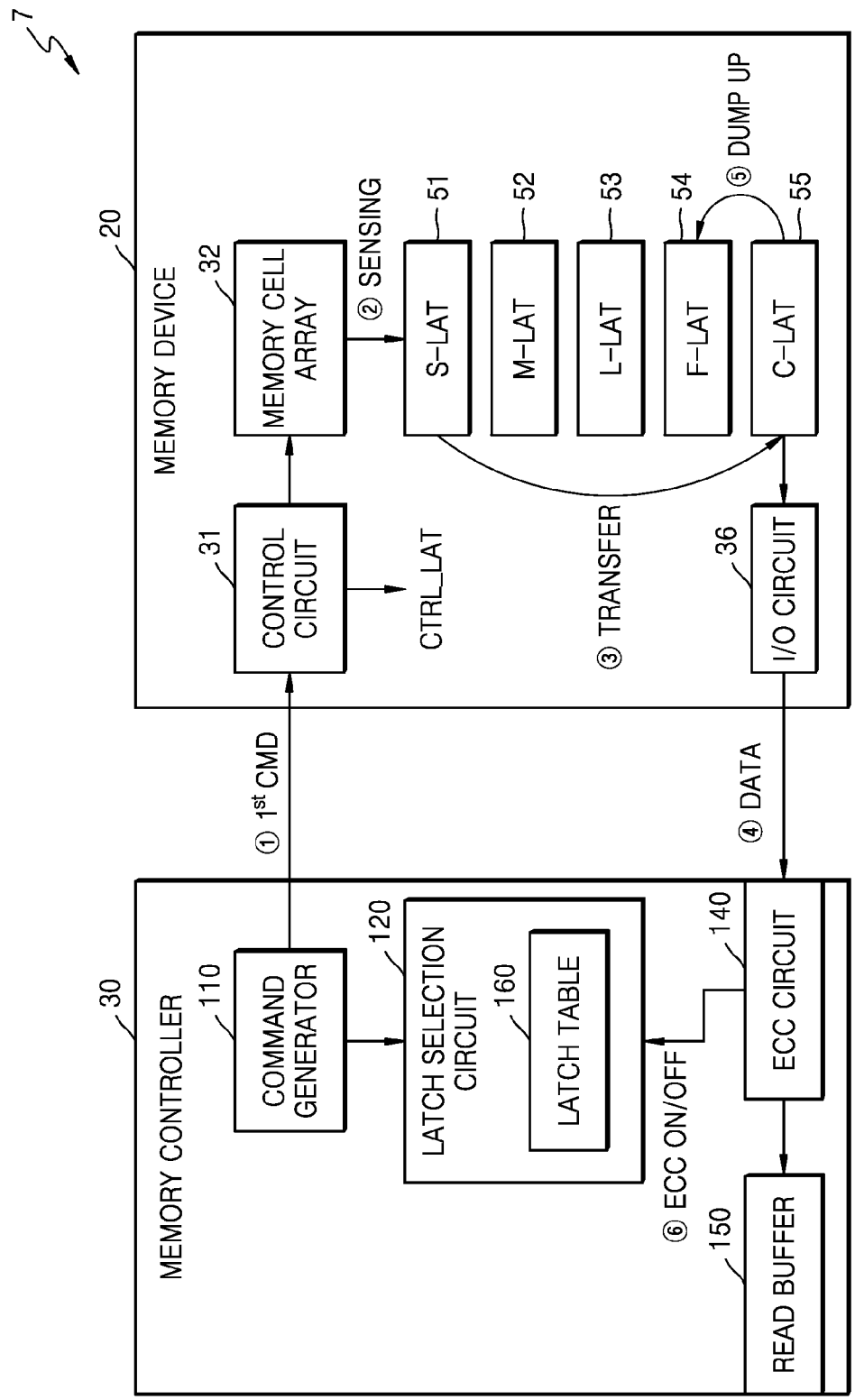
FIG. 9 is a block diagram describing a memory system performing a dump-up operation, according to an example embodiment.
Figure 10:
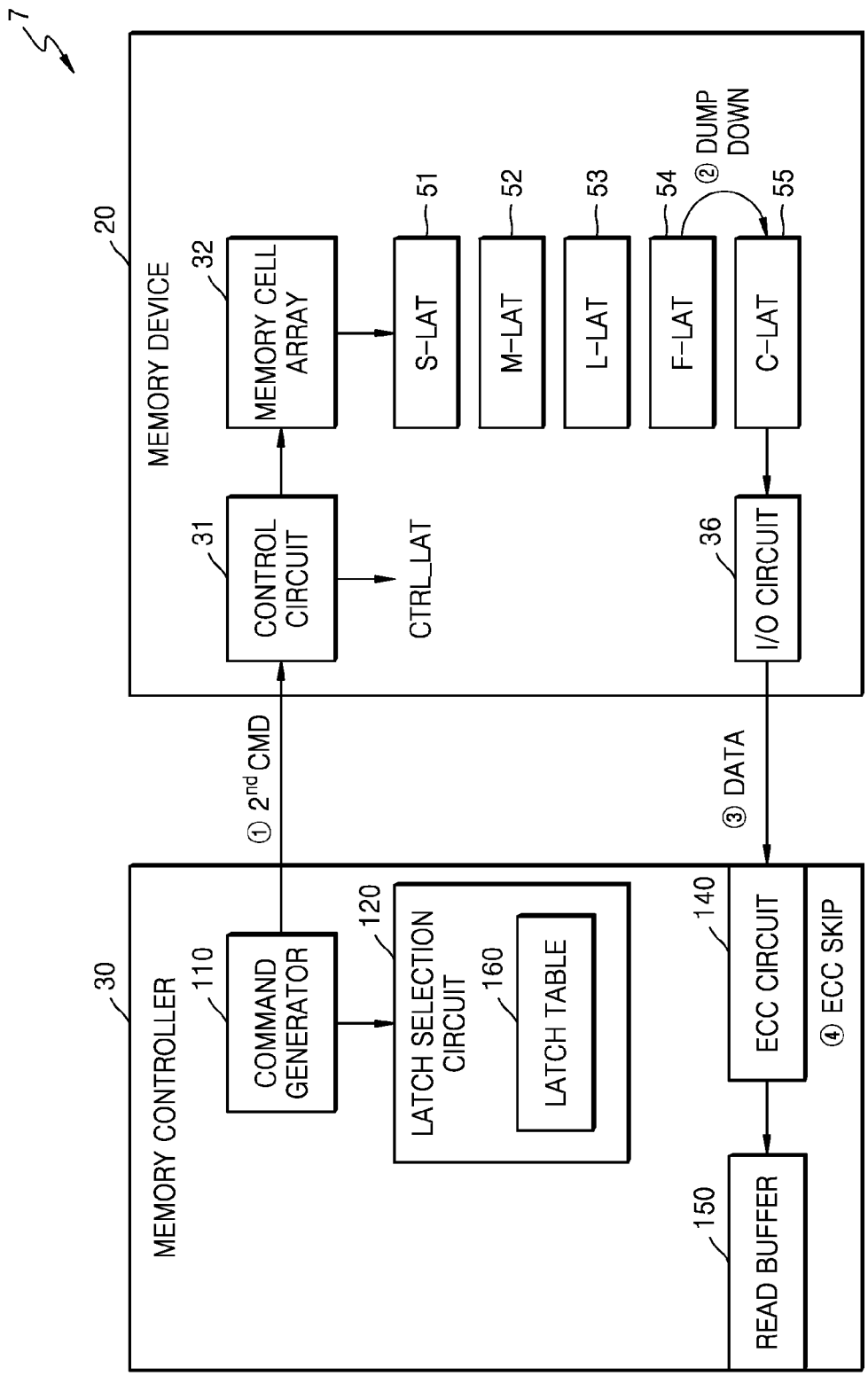
FIG. 10 is a block diagram describing a memory system performing a dump-down operation, according to an example embodiment.
Figure 11:
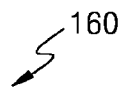
FIG. 11 is a diagram describing a latch table according to an example embodiment.

FIG. 9 is a block diagram describing a memory system performing a dump-up operation, according to an example embodiment. FIG. 10 is a block diagram describing a memory system performing a dump-down operation, according to an example embodiment. FIG. 11 is a diagram describing a latch table according to an example embodiment.

Referring to FIG. 9, a memory system 7 may include a memory controller 30 and a memory device 20. The memory controller 30 may include an error code correction (ECC) circuit 140 and a read buffer 150. As described above with reference to FIG. 6, a command generator 110 may provide a first command (1$^{st}$ CMD) to the memory device 20 (①). In some embodiments, the first command (1$^{st}$ CMD) may include a read command and a dump-up command, and may also include a physical address PA3 and an identification number of a force latch 54. Data of a page corresponding to the physical address PA3 may be sensed by a sensing latch 51 (②). The data sensed by the sensing latch 51 may be transferred to a cache latch 55 (③). The data transferred to the cache latch 55 may be output to the memory controller 30 (④). The data transferred to the cache latch 55 may be dumped up to the force latch 54 (⑤).

Referring to FIG. 9, the ECC circuit 140 may receive data from the memory device 20. The ECC circuit 140 may perform an error detection and correction function on data. The ECC circuit 140 may output ECC ON/OFF information on the basis of the presence of error detection and correction (⑥). The ECC ON/OFF information may be information representing whether error detection and correction has been performed on received data. The ECC ON/OFF information may be referred to herein as error correction information. For example, when an error of the received data is detected and corrected, the ECC ON/OFF information may represent 'ON'. For example, when an error of the received data is not detected, the ECC ON/OFF information may represent 'OFF'. The ECC circuit 140 may transfer no-error data or error-corrected data to the read buffer 150. The read buffer 150 may be a memory which temporarily stores data read from the memory device 20.

The latch selection circuit 120 may update a latch table 160 on the basis of the ECC ON/OFF information. Referring to FIG. 11, the latch table 160 may further include the ECC ON/OFF information. For example, 'OFF' may indicate that data dumped up to a force latch 54 does not have an error may be recorded in a latch table 160. Therefore, when a read command corresponding to a physical address PA3 is again received, an ECC operation on dumped-up data may be omitted in the force latch 54 for this again-received physical address. Because the ECC operation is omitted, a read time is shortened.

Referring to FIG. 10, as described above with reference to FIG. 7, a command generator 110 may provide a second command (2nd CMD) to the memory device 20 (①). The second command (2$^{nd}$ CMD) may include a dump-down command and may also include an identification number of the force latch 54. The data stored in the force latch 54 may be dumped down to the cache latch 55 (②). The data dumped down to the cache latch 55 may be provided to the memory controller 30 (③). According to the latch table 160, the data stored in the force latch 54 may be known to be error-free, and an ECC operation may be omitted (④). That is, the data stored in the force latch 54 may be transferred to the read buffer 150 without an ECC operation. For example, the error correction information from the table may indicate that there is no need to evaluate if the data stored in the force latch 54 would be found to have an error needing correction by the ECC function.

Figure 12:
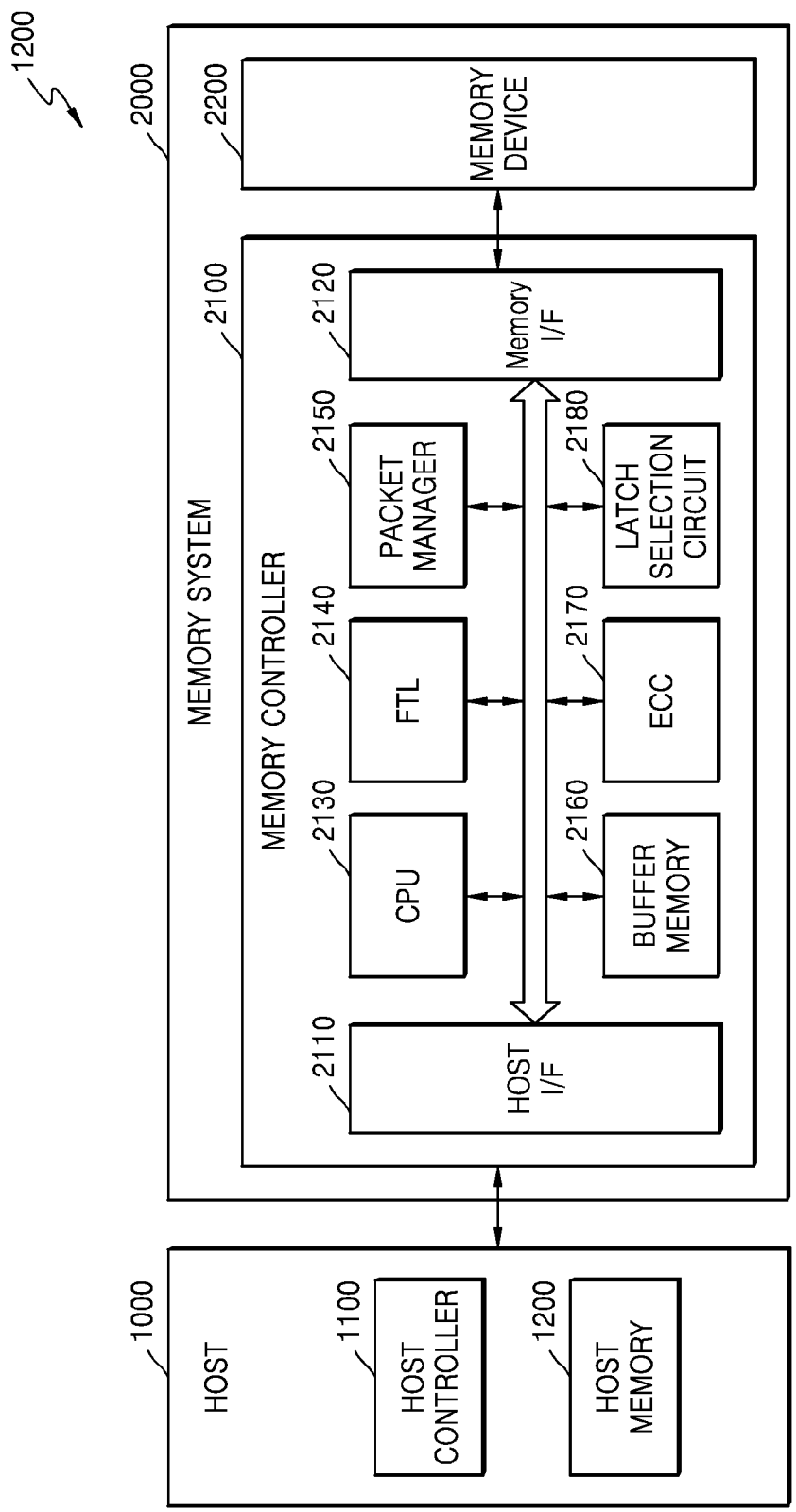
FIG. 12 is a block diagram illustrating a host-memory system according to an example embodiment.

FIG. 12 is a block diagram of a host-memory system 1200 according to an example embodiment.

The host-memory system 1200 may include a host 1000 and a memory system 2000. Further, the memory system 2000 may include a memory controller 2100 and a memory device 2200. According to an example embodiment, the host 1000 may include a host controller 1100 and a host memory 1200. The host memory 1200 may serve as a buffer memory configured to temporarily store data to be transmitted to the memory system 2000 or data received from the memory system 2000.

The memory system 2000 may include storage media configured to store data in response to requests from the host 1000. As an example, the memory system 2000 may include at least one of an SSD, an embedded memory, and a removable external memory. When the memory system 2000 is an SSD, the memory system 2000 may be a device that conforms to an NVMe standard. When the memory system 2000 is an embedded memory or an external memory, the memory system 2000 may be a device that conforms to a UFS standard or an eMMC standard. Each of the host 1000 and the memory system 2000 may generate a packet according to an adopted standard protocol and transmit the packet.

When the memory device 2200 of the memory system 2000 includes a flash memory, the flash memory may include a 2D NAND memory array or a 3D (or vertical) NAND (VNAND) memory array. As another example, the memory system 2000 may include various other kinds of NVMs. For example, the memory system 2000 may include magnetic RAM (MRAM), spin-transfer torque MRAM, conductive bridging RAM (CBRAM), ferroelectric RAM (FRAM), PRAM, RRAM, and various other kinds of memories.

According to an example embodiment, the host controller 1100 and the host memory 1200 may be implemented as separate semiconductor chips. Alternatively, in some embodiments, the host controller 1100 and the host memory 1200 may be integrated in the same semiconductor chip. As an example, the host controller 1100 may be any one of a plurality of modules included in an application processor (AP). The AP may be implemented as a System on Chip (SoC). Further, the host memory 1200 may be an embedded memory included in the AP or an NVM or memory module located outside the AP.

The host controller 1100 may manage an operation of storing data (e.g., write data) of a buffer region of the host memory 1200 in the memory device 2200 or an operation of storing data (e.g., read data) of the memory device 2200 in the buffer region.

The memory controller 2100 may include a host interface 2110, a memory interface 2120, and a CPU 2130. Furthermore, the memory controller 2100 may further include a flash translation layer (FTL) 2140, a packet manager 2150, a buffer memory 2160, an error correction code (ECC) circuit 2170, and a latch selection circuit 2180. The memory controller 2100 may further include a working memory (not shown) in which the FTL 2140 is loaded. The CPU 2130 may execute the FTL 2140 to control data write and read operations on the memory device 2200.

The host interface 2110 may transmit and receive packets to and from the host 1000. A packet transmitted from the host 1000 to the host interface 2110 may include a command or data to be written to the memory device 2200. A packet transmitted from the host interface 2110 to the host 1000 may include a response to the command or data read from the memory device 2200. The memory interface 2120 may transmit data to be written to the memory device 2200 to the memory device 2200 or receive data read from the memory device 2200. The memory interface 2120 may be configured to comply with a standard protocol, such as Toggle or open NAND flash interface (ONFI).

The FTL 2140 may perform various functions, such as an address mapping operation, a wear-leveling operation, and a garbage collection operation. The address mapping operation may be an operation of converting a logical address received from the host 1000 into a physical address used to actually store data in the memory device 2200. The wear-leveling operation may be a technique for preventing excessive deterioration of a specific block by allowing blocks of the memory device 2200 to be uniformly used. As an example, the wear-leveling operation may be implemented using a firmware technique that balances erase counts of physical blocks. The garbage collection operation may be a technique for ensuring usable capacity in the memory device 2200 by erasing an existing block after copying valid data of the existing block to a new block.

The packet manager 2150 may generate a packet according to a protocol of an interface, which consents to the host 1000, or parse various types of information from the packet received from the host 1000. In addition, the buffer memory 2160 may temporarily store data to be written to the memory device 2200 or data to be read from the memory device 2200. Although the buffer memory 2160 may be a component included in the memory controller 2100, the buffer memory 2160 may be outside the memory controller 2100. According to an example embodiment, the buffer memory 2160 may include a read buffer (for example, 150 of FIG. 5).

The ECC circuit 2170 may perform error detection and correction operations on read data read from the memory device 2200. More specifically, the ECC circuit 2170 may generate parity bits for write data to be written to the memory device 2200, and the generated parity bits may be stored in the memory device 2200 together with write data. During the reading of data from the memory device 2200, the ECC circuit 2170 may correct an error in the read data by using the parity bits read from the memory device 2200 along with the read data, and output error-corrected read data.

The latch selection circuit 2180 may select a latch (for example, 54 of FIG. 6) corresponding to a physical address generated by the FTL 2140 among a plurality of latches (for example, 52, 53, and 54 of FIG. 6) included in the memory device 2200. The latch selection circuit 2180 may be an example of the latch selection circuit 120 described with reference to FIGS. 6, 7, 9 and 10.

Figure 13:
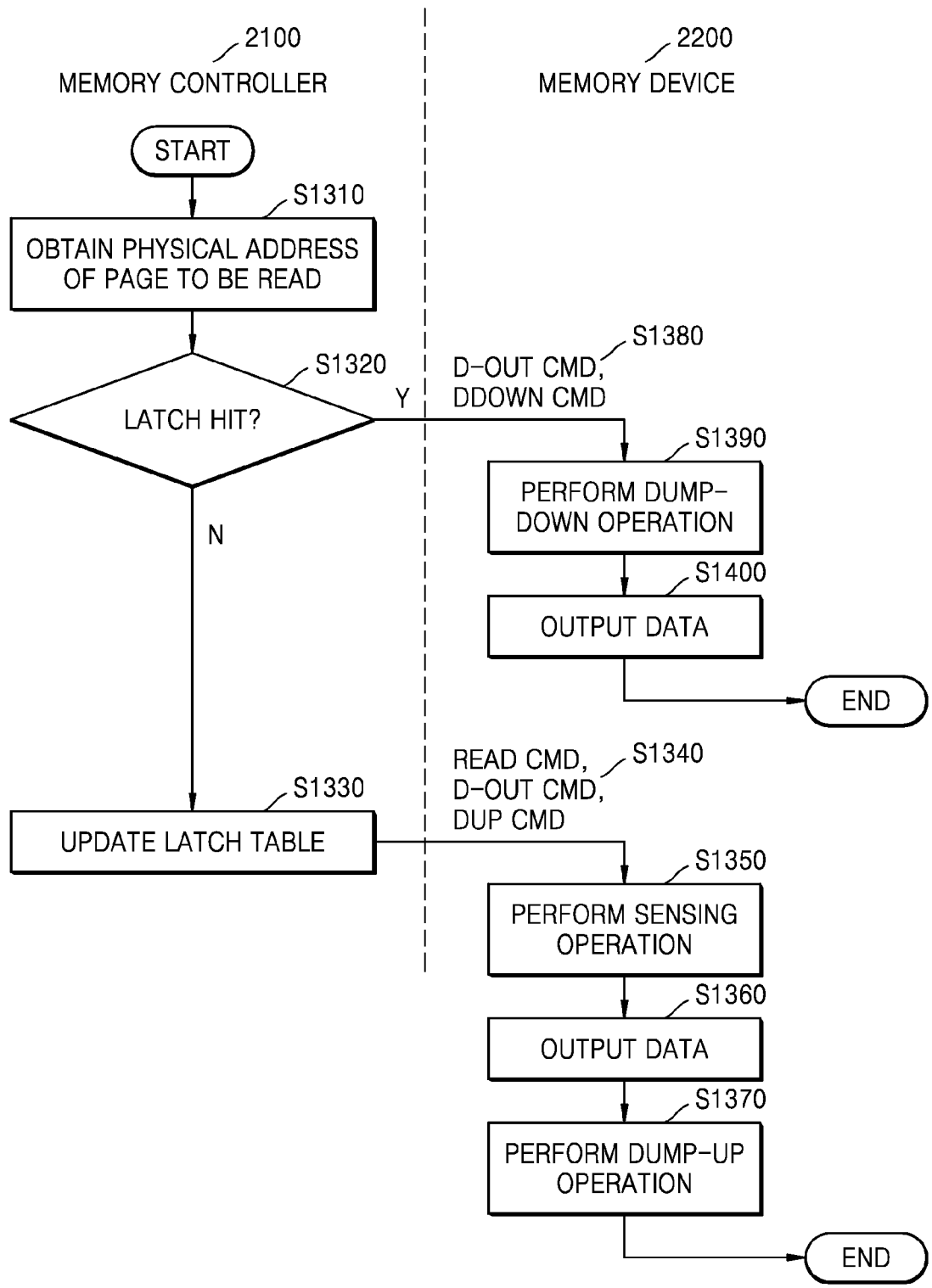
FIG. 13 is a diagram describing an operating method of a memory system, according to an example embodiment.

FIG. 13 is a diagram describing an operating method of a memory system, according to an example embodiment. FIG. 13 will be described below with reference to FIGS. 5, 6, and 12.

Referring to FIG. 13, the operating method of the memory system may include a plurality of operations S1310 to S1400.

In operation S1310, a memory controller 2100 may obtain a physical address corresponding to a page, which is to be read. In detail, an FTL 2140 may convert a logical address, storing data which is to be read, into a physical address.

In operation S1320, the memory controller 2100 may determine the presence of a latch hit, on the basis of a latch table (for example, 130 of FIG. 7). When the physical address is included in the latch table, the latch hit may be determined, and when the physical address is not included in the latch table, a latch miss may be determined. When the latch hit is determined, operation S1380 may be performed, and when the latch miss is determined, operation S1330 may be performed.

In operation S1330, the memory controller 2100 may update the latch table 130. In detail, one latch may be selected from among latches included in the latch table 130 and may be mapped to an obtained physical address.

In operation S1340, the memory controller 2100 may provide the memory device 2200 with a read command READ CMD, a data out command D-OUT CMD, and a dump-up command DDUP CMD. In operation S1340, a command output by the memory controller 2100 may be referred to as a first command. That is, when the latch miss is determined, a command output by the memory controller 2100 may be the first command. The read command READ CMD may be a command indicating a sensing operation of sensing data from a page corresponding to a physical address. The data out command D-OUT CMD may be a command indicating an output operation of outputting data to the memory controller 2100. The dump-up command DDUP CMD may be a command indicating a dump-up operation of transferring data, stored in the cache latch 55, to the program latches 52 to 54. In some embodiments, at least two of the read command READ CMD, the data out command D-OUT CMD, and the dump-up command DDUP CMD may be included in one command sequence.

In operation S1350, the memory device 2200 may perform a sensing operation of sensing data from a page corresponding to a physical address. The sensed data may be stored in the sensing latch 51.

In operation S1360, the memory device 2200 may output the sensed data to the memory controller 2100. Data may be stored in the cache latch 55 before being output to the memory controller 2100.

In operation S1370, the memory device 2200 may perform a dump-up operation of transferring data, stored in the cache latch 55, to the program latches 52 to 54.

In operation S1380, the memory controller 2100 may provide the memory device 2100 with the data out command D-OUT CMD and a dump-down command DDOWN CMD. In operation S1380, a command output by the memory controller 2100 may be referred to as a second command. That is, when the latch hit is determined, a command output by the memory controller 2100 may be the second command. The dump-down command DDOWN CMD may indicate a dump-down operation of transferring data, stored in the program latches 52 to 54, to the cache latch 55.

In operation S1390, the memory device 2200 may perform a dump-down operation of transferring data, stored in the program latches 52 to 54, to the cache latch 55. This may be a state where data stored in a page corresponding to a physical address is previously dumped up to the program latches 52 to 54.

In operation S1400, the memory device 2200 may output the data of the cache latch 55 to the memory controller 2100.

Because a sensing operation is omitted in the latch hit, the memory controller 2100 may quickly obtain data corresponding to the read command.

Figure 14:
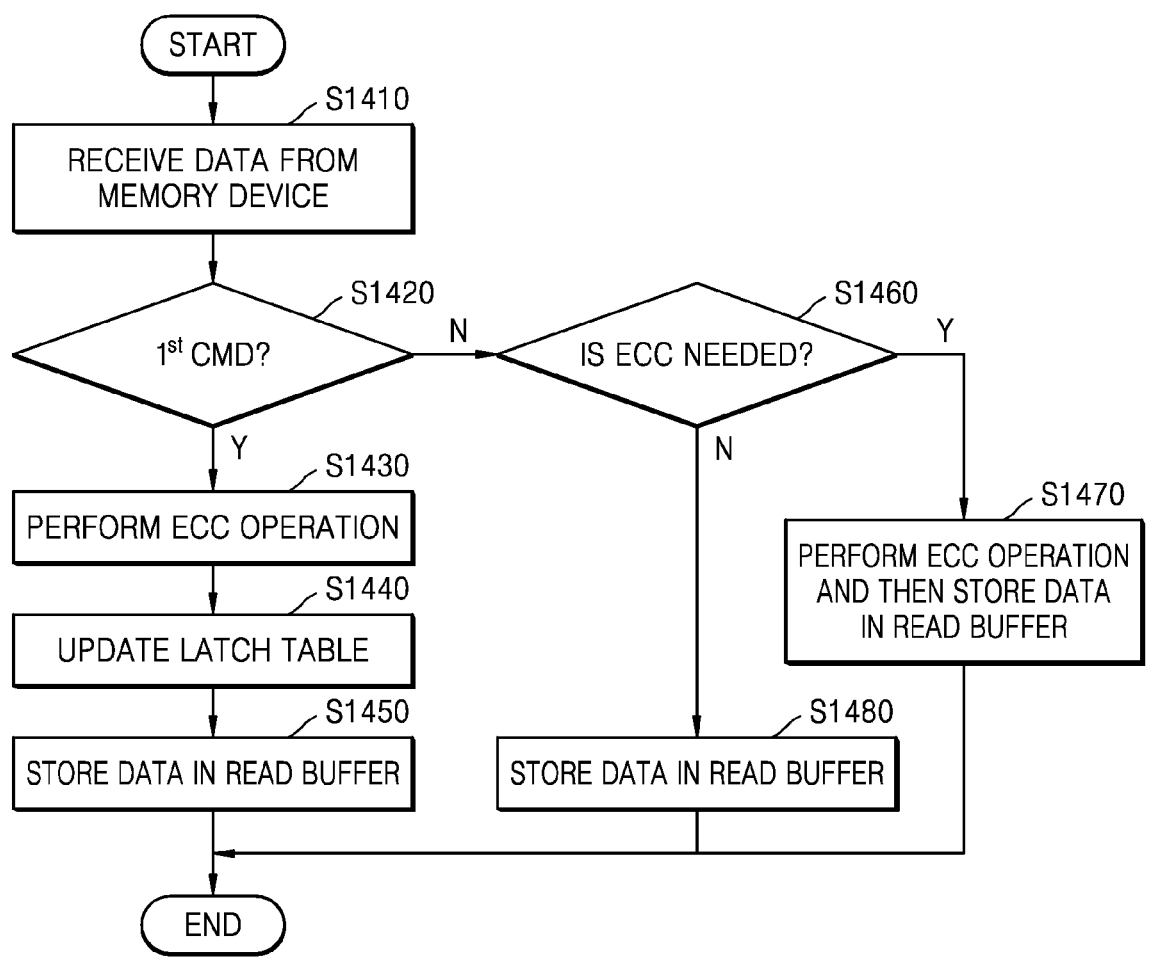
FIG. 14 is a flowchart describing an operating method of a memory controller, according to an example embodiment.

FIG. 14 is a flowchart describing an operating method of a memory controller, according to an example embodiment. FIG. 14 will be described below with reference to FIGS. 6 and 12. The operating method of the memory system may include a plurality of operations S1410 to S1440 and may be performed after operation S1400 or S1360 of FIG. 13.

In operation S1410, the memory controller 2100 may receive data from the memory device 2200.

In operation S1420, the memory controller 2100 may determine whether received data is data corresponding to a first command. Data corresponding to the first command may be data which is received by the memory controller 2100 in operation S1360 of FIG. 13. Data not corresponding to the first command may be data is received by the memory controller 2100 in operation S1400 of FIG. 13. When the received data is data corresponding to the first command, operation S1430 may be performed. When the received data is not the data corresponding to the first command, operation S1460 may be performed.

In operation S1430, the memory controller 2100 may perform an ECC operation on the received data to detect a presence of an error. When an error is detected in the received data, the error of the data may be corrected through the ECC operation.

In operation S1440, the memory controller 2100 may update the latch table 160. As illustrated in FIG. 11, the memory controller 2100 may receive data stored in a page corresponding to a physical address PA3. When an error is not detected in the corresponding data, ECC OFF may be recorded as error correction information in the latch table 160. ECC OFF may be information indicating that an ECC operation is not needed in performing a subsequent read operation on the same physical address. On the other hand, when an error is detected in the data, ECC ON may be recorded as error correction information in the latch table 160. ECC ON may be information indicating that an ECC operation to correct an error is needed in performing a subsequent read operation on the same physical address.

In operation S1450, the memory controller 2100 may store ECC-corrected data in the read buffer 150.

In operation S1460, the memory controller 2100 may determine whether ECC is needed for the received data on the basis of the latch table 160. Referring to FIG. 11, when the received data is read data corresponding to a physical address PA2, an ECC operation may be needed for the received data. On the other hand, when the received data is read data corresponding to the physical address PA3, an ECC operation for correction may not be needed for the received data. When the ECC operation is needed, operation S1470 may be performed. When the ECC operation is not needed, operation S1480 may be performed.

In operation S1470, the memory controller 2100 may perform an ECC operation on the received data and may store ECC-corrected data in the read buffer 150.

In operation S1480, the memory controller 2100 may omit an ECC operation on the received data and may store the received data in the read buffer 150.

The memory controller 2100 according to an embodiment may selectively perform an ECC operation on the basis of the latch table 160, thereby shortening a read time.

Figure 15:
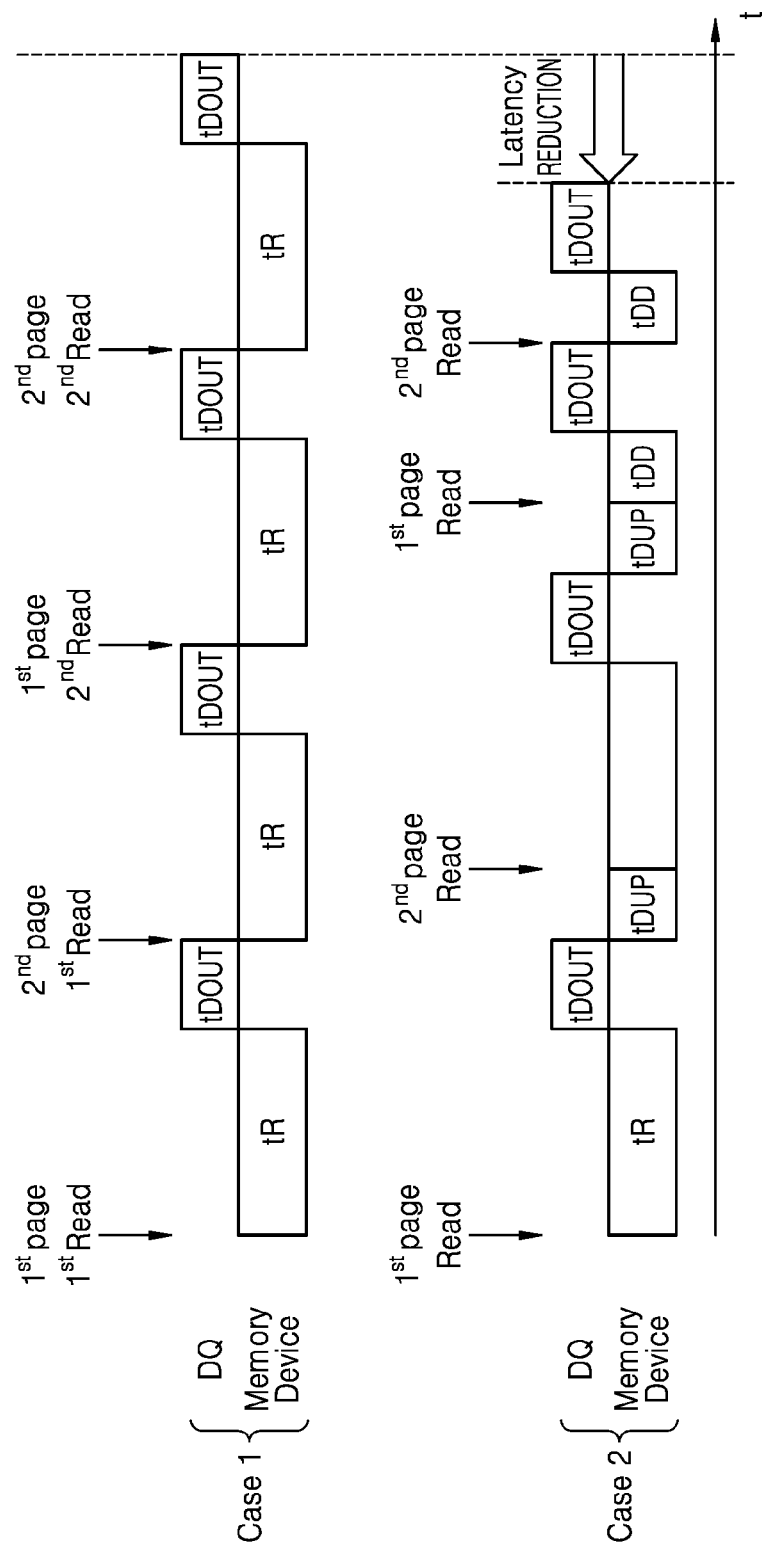
FIG. 15 is a diagram describing a read time according to an example embodiment.

FIG. 15 is a diagram describing a read time according to an example embodiment.

The upper portion of FIG. 15 describes a first case where a sensing operation is always performed based on a read command, and the lower portion of FIG. 15 describes a second case where a sensing operation is omitted based on a dump-up operation and a dump-down operation. The second case is applicable, for example, when a physical address of data to be read is present in the latch table 160. FIG. 15 will be described below with reference to FIGS. 1, 2, and 5.

According to the first case, in response to a first read command ($1^{st}$ page $1^{st}$ read) corresponding to a first page, the memory device 2 may sense, by using the sensing latch 51, data stored in the first page of the memory cell array 32 for a sensing time tR. The data stored in the sensing latch 51 may be transferred to the memory controller 10 via the cache latch 55 for a data output time tDOUT, on the basis of a DQ signal. The memory device 2 may perform the same operation in response to a first read command ($2^{nd}$ page $1^{st}$ read) corresponding to a second page, a second read command ($1^{st}$ page $2^{nd}$ read) corresponding to the first page, and a second read command ($2^{nd}$ page $2^{nd}$ read) corresponding to the second page. Therefore, a time "4*tR+4*tDOUT" may be taken until a read command ($1^{st}$ page read) corresponding to the first page is executed twice and a read command ($2^{nd}$ page read) corresponding to the second page is executed twice.

According to the second case, like the first case, in response to the first read command ($1^{st}$ page $1^{st}$ read) corresponding to the first page, the memory device 2 may sense, by using the sensing latch 51, data stored in the first page of the memory cell array 32 for the sensing time tR. The data stored in the sensing latch 51 may be transferred to the memory controller 10 via the cache latch 55 for a data output time tDOUT, on the basis of a DQ signal. Furthermore, for a dump-up time tDUP, the memory device 2 may perform a dump-up operation of transferring data, stored in the cache latch 55, to a program latch (for example, the force latch 54). The dump-up operation may be an operation of transferring data between latches, and thus, may be performed for a short time. The memory device 2 may perform the same operation in response to the first read command ($2^{nd}$ page $1^{st}$ read) corresponding to the second page. However, in response to the first read command ($2^{nd}$ page $1^{st}$ read) corresponding to the second page, the memory device 2 may transfer data to another latch (for example, the upper bit latch 52) instead of the force latch 54 in performing the dump-up operation.

In response to the second read command ($1^{st}$ page $2^{nd}$ read) corresponding to the first page, the memory device 2 may perform a dump-down operation of transferring data stored in the force latch 54 to the cache latch 55 for a dump-down time tDD. The memory device 2 may transfer the data stored in the cache latch 55 to the memory controller 10 for the data output time tDOUT. Likewise, in response to the second read command ($2^{nd}$ page $2^{nd}$ read) corresponding to the second page, the memory device 2 may transfer data of the upper bit latch 52 to the cache latch 55 and may output the data of the cache latch 55. Therefore, a time "2*tR+4*tDOUT+2*tDUP+2*tDD" may be taken until the read command (1st page read) corresponding to the first page is executed twice and the read command ($2^{nd}$ page read) corresponding to the second page is executed twice. The sensing time tR may be greater than a sum of the dump-up time tDUP and the dump-down time tDD, and thus, read latency may decrease in the second case.

Figure 16:
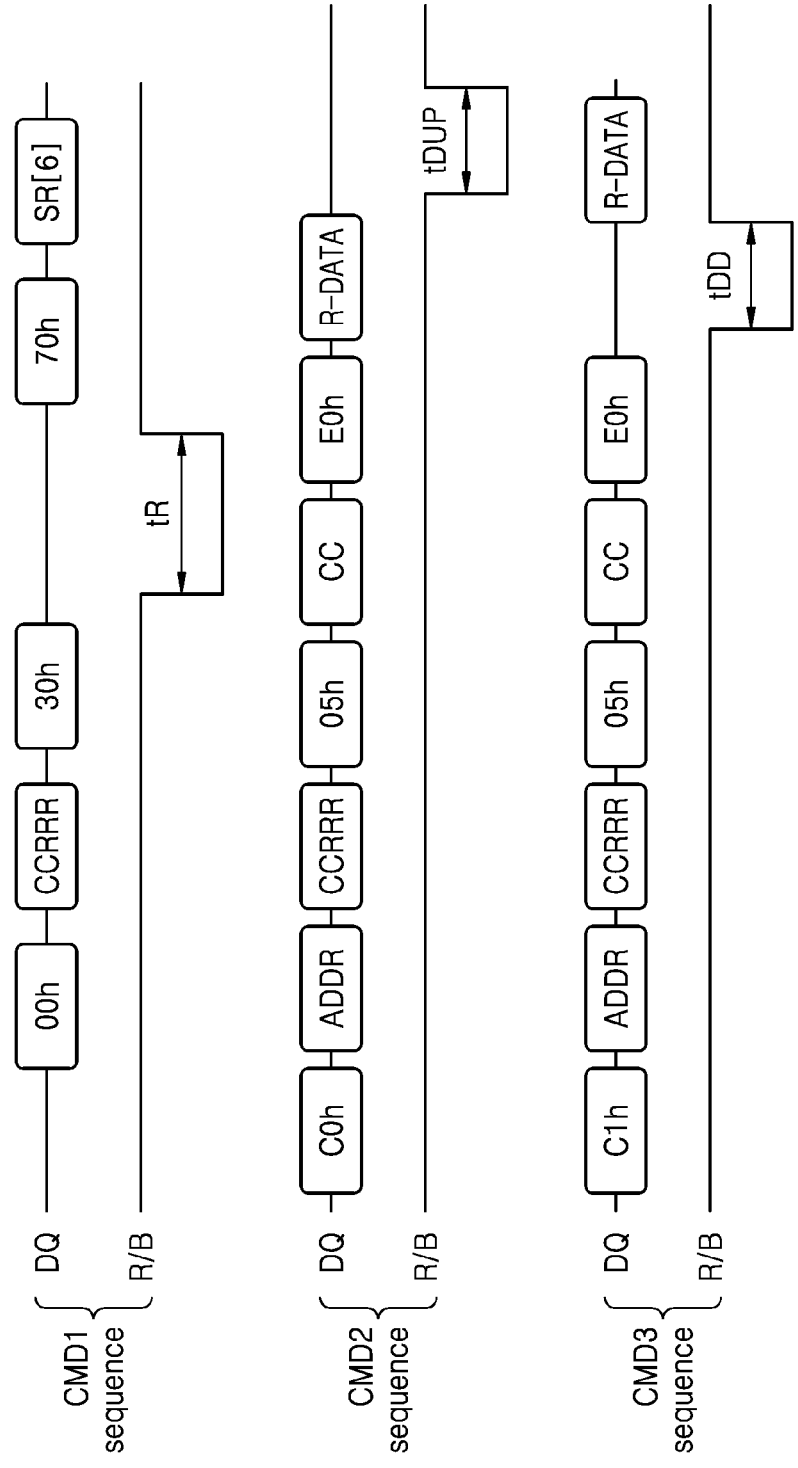
FIG. 16 is a diagram describing a command sequence according to an example embodiment.

FIG. 16 is a diagram describing a command sequence according to an example embodiment. FIG. 16 will be described below with reference to FIG. 12.

The memory controller 2100 and the memory device 2200 may transfer/receive a DQ signal and a ready/busy (R/B) signal. Data or a command may be transferred/received based on the DQ signal, and a ready state and a busy state of the memory device 2200 may be detected based on the R/B signal.

A first command sequence may be a command sequence indicating a sensing operation. According to the first command sequence, 00h, CCRRR, and 30h may be transferred to the memory device 2200 on the basis of the DQ signal. CCRRR may represent a physical address of a page which is to be read. Subsequently, the memory device 2200 may sense data for a sensing time tR, and thus, an R/B pin may represent a busy state. The memory controller 2100 may transfer 70h and SR[6] to the memory device 2200 after the sensing time tR elapses, and thus, whether sensing is completed may be checked.

A second command sequence may be a command sequence indicating a dump-up operation and a data output operation. According to the second command sequence, C0h, ADDR, CCRRR, 05h, CC, and E0h may be transferred to the memory device 2200 through a DQ pin. ADDR may denote an identification number of a latch (for example, 54 of FIG. 5) which is to be updated. CCRRR may represent a physical address of a memory cell connected to the latch 54, and CC may represent a column address of the memory cell connected to the latch 54. The memory device 2200 may receive a command and then provide read data R-DATA to the memory controller 2100. The memory device 2200 may transfer the data stored in the cache latch 55 to the latch 54 which is to be dumped up, for a dump-up time tDUP. A busy signal may be output for the dump-up time tDUP.

A third command sequence may be a command sequence indicating a dump-down operation and a data output operation. According to the third command sequence, C1h, ADDR, CCRRR, 05h, CC, and E0h may be transferred to the memory device 2200 on the basis the DQ signal. ADDR may denote an identification number of a latch (for example, 54 of FIG. 5) which is to be dumped down. CCRRR may represent a physical address of a memory cell connected to the latch 54. For example, CC may represent a column address (Y-ADDR of FIG. 2) of a memory cell connected to the latch 54, and RRR may represent a row address (for example, X-ADDR of FIG. 2) of the memory cell connected to the latch 54. The memory device 2200 may transfer the data, stored in the latch 54, to the cache latch 55 for a dump-down time tDD after a command is received. The busy signal may be output for the dump-down time tDD. After dump-down is completed, the data stored in the cache latch 55 may be provided as read data R-DATA to the memory controller 2100.

Figure 17:
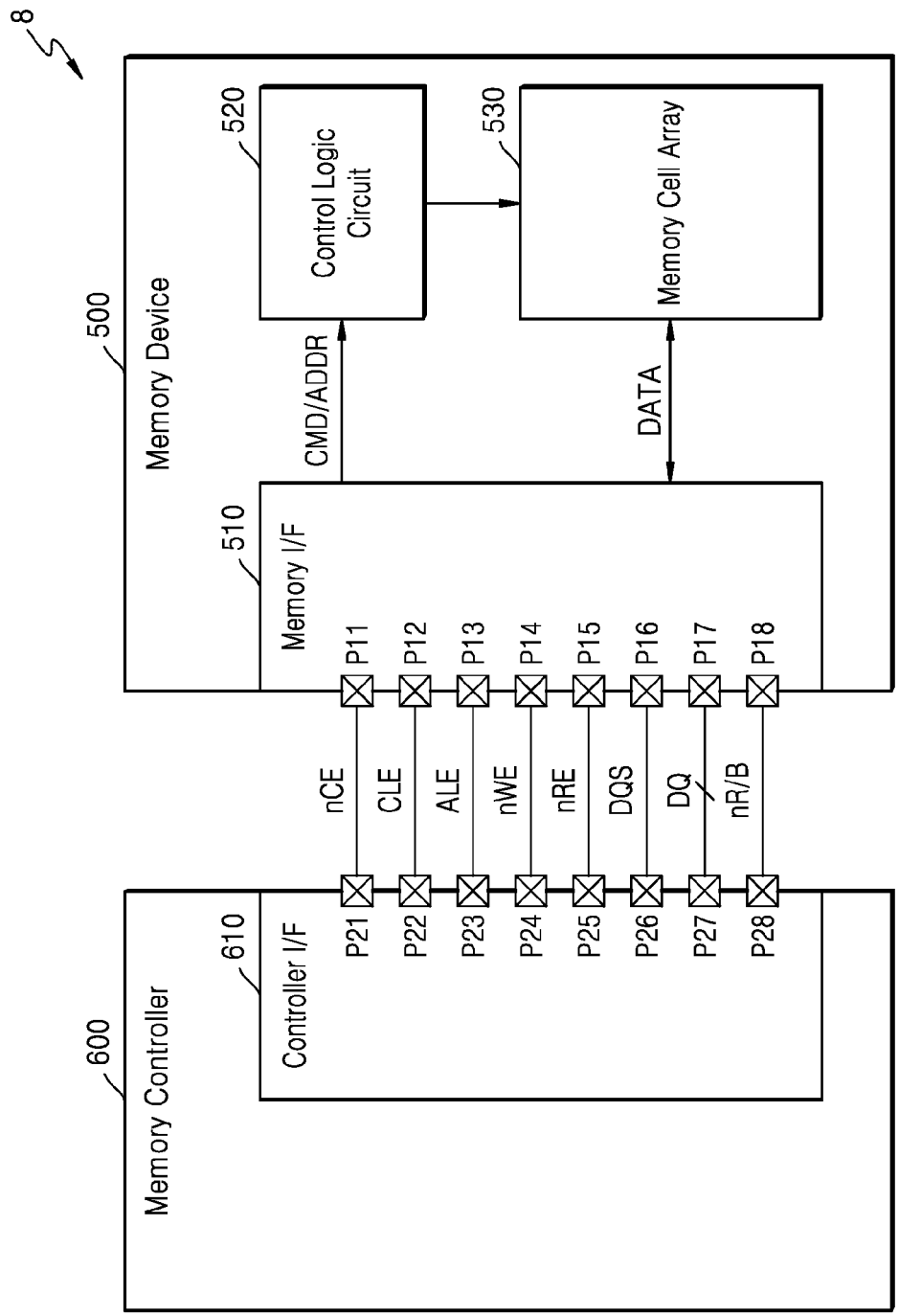
FIG. 17 is a block diagram illustrating a memory system according to an example embodiment.

FIG. 17 is a block diagram of a memory system 8 according to an example embodiment. Referring to FIG. 17, the memory system 8 may include a memory device 500 and a memory controller 600. The memory device 500 may correspond to one of the memory device 20 of FIGS. 1 and 6, the memory device 2 of FIG. 2 and the memory device 2200 of FIG. 12. The memory controller 600 may correspond to one of the memory controller 10 of FIGS. 1 and 6, the memory controller 30 of FIG. 9 and the memory controller 2100 of FIG. 12.

The memory device 500 may include first to eighth pins P11 to P18, a memory interface circuitry 510, a control logic circuitry 520, and a memory cell array 530.

The memory interface circuitry 510 may receive a chip enable signal nCE from the memory controller 600 through the first pin P11. The memory interface circuitry 510 may transmit and receive signals to and from the memory controller 600 through the second to eighth pins P12 to P18 in response to the chip enable signal nCE. For example, when the chip enable signal nCE is in an enable state (e.g., a low level), the memory interface circuitry 510 may transmit and receive signals to and from the memory controller 600 through the second to eighth pins P12 to P18.

The memory interface circuitry 510 may receive a command latch enable signal CLE, an address latch enable signal ALE, and a write enable signal nWE from the memory controller 600 through the second to fourth pins P12 to P14. The memory interface circuitry 510 may receive a data signal DQ from the memory controller 600 through the seventh pin P17 or transmit the data signal DQ to the memory controller 600. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s). The DQ signal of FIG. 16 may be transmitted or received through the seventh pin P17.

The memory interface circuitry 510 may obtain the command CMD from the data signal DQ, when the data signal DQ is received in an enable section (e.g., a high-level state) of the command latch enable signal CLE. Timing for observation of the data signal DQ may correspond to toggle time points of the write enable signal new. For example, the command CMD may be obtained based on toggle time points of the write enable signal nWE. Similarly, the memory interface circuitry 510 may obtain the address ADDR from the data signal DQ received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 510 may obtain the command CMD or the address ADDR based on toggle time points of the write enable signal nWE.

The memory interface circuitry 510 may receive a read enable signal nRE from the memory controller 600 through the fifth pin P15. The memory interface circuitry 510 may receive a data strobe signal DQS from the memory controller 600 through the sixth pin P16 or transmit the data strobe signal DQS to the memory controller 600.

In a data (DATA) output operation of the memory device 500, the memory interface circuitry 510 may receive the read enable signal nRE, which toggles through the fifth pin P15, before outputting the data DATA. The memory interface circuitry 510 may generate the data strobe signal DQS, which toggles based on the toggling of the read enable signal nRE. For example, the memory interface circuitry 510 may generate a data strobe signal DQS, which starts toggling after a predetermined delay (e.g., tDQSRE), based on a toggling start time of the read enable signal nRE. The memory interface circuitry 510 may transmit the data signal DQ including the data DATA based on a toggle time point of the data strobe signal DQS. Thus, the data DATA may be aligned with the toggle time point of the data strobe signal DQS and transmitted to the memory controller 600.

In a data (DATA) input operation of the memory device 500, when the data signal DQ including the data DATA is received from the memory controller 600, the memory interface circuitry 510 may receive the data strobe signal DQS, which toggles, along with the data DATA from the memory controller 600. The memory interface circuitry 510 may obtain the data DATA from the data signal DQ based on toggle time points of the data strobe signal DQS. For example, the memory interface circuitry 510 may sample the data signal DQ at rising and falling edges of the data strobe signal DQS and obtain the data DATA.

The memory interface circuitry 510 may transmit a ready/busy output signal nR/B to the memory controller 600 through the eighth pin P18. The memory interface circuitry 510 may transmit state information of the memory device 500 through the ready/busy output signal nR/B to the memory controller 600. When the memory device 500 is in a busy state (i.e., when operations are being performed in the memory device 500), the memory interface circuitry 510 may transmit a ready/busy output signal nR/B indicating the busy state to the memory controller 600. When the memory device 500 is in a ready state (i.e., when operations are not performed or completed in the memory device 500), the memory interface circuitry 510 may transmit a ready/busy output signal nR/B indicating the ready state to the memory controller 600. For example, while the memory device 500 is reading data DATA from the memory cell array 530 in response to a page read command, the memory interface circuitry 510 may transmit a ready/busy output signal nR/B indicating a busy state (e.g., a low level) to the memory controller 600. For example, while the memory device 500 is programming data DATA to the memory cell array 530 in response to a program command, the memory interface circuitry 510 may transmit a ready/busy output signal nR/B indicating the busy state to the memory controller 600. The R/B signal of FIG. 16 may be transmitted or received through the eighth pin P18. Thus a pin of the memory device 500, in some embodiments, is used to indicate a ready state or used to indicate a busy state.

The control logic circuitry 520 may control all operations of the memory device 500. The control logic circuitry 520 may receive the command/address CMD/ADDR obtained from the memory interface circuitry 510. The control logic circuitry 520 may generate control signals for controlling other components of the memory device 500 in response to the received command/address CMD/ADDR. For example, the control logic circuitry 520 may generate various control signals for programming data DATA to the memory cell array 530 or reading the data DATA from the memory cell array 530.

The memory cell array 530 may store the data DATA obtained from the memory interface circuitry 510, via the control of the control logic circuitry 520. The memory cell array 530 may output the stored data DATA to the memory interface circuitry 510 via the control of the control logic circuitry 520.

The memory cell array 530 may include a plurality of memory cells. For example, the plurality of memory cells may be flash memory cells. However, the embodiments are not limited thereto, and the memory cells may be RRAM cells, FRAM cells, PRAM cells, thyristor RAM (TRAM) cells, or MRAM cells. Hereinafter, an example embodiment in which the memory cells are NAND flash memory cells will mainly be described.

The memory controller 600 may include first to eighth pins P21 to P28 and a controller interface circuitry 610. The first to eighth pins P21 to P28 may respectively correspond to the first to eighth pins P11 to P18 of the memory device 500.

The controller interface circuitry 610 may transmit a chip enable signal nCE to the memory device 500 through the first pin P21. The controller interface circuitry 610 may transmit and receive signals to and from the memory device 500, which is selected by the chip enable signal nCE, through the second to eighth pins P22 to P28.

The controller interface circuitry 610 may transmit the command latch enable signal CLE, the address latch enable signal ALE, and the write enable signal nWE to the memory device 500 through the second to fourth pins P22 to P24. The controller interface circuitry 610 may transmit or receive the data signal DQ to and from the memory device 500 through the seventh pin P27. The DQ signal of FIG. 16 may be transmitted or received through the seventh pin P27.

The controller interface circuitry 610 may transmit the data signal DQ including the command CMD or the address ADDR to the memory device 500 along with the write enable signal nWE, which toggles. The controller interface circuitry 610 may transmit the data signal DQ including the command CMD to the memory device 500 by transmitting a command latch enable signal CLE having an enable state. Also, the controller interface circuitry 610 may transmit the data signal DQ including the address ADDR to the memory device 500 by transmitting an address latch enable signal ALE having an enable state.

The controller interface circuitry 610 may transmit the read enable signal nRE to the memory device 500 through the fifth pin P25. The controller interface circuitry 610 may receive or transmit the data strobe signal DQS from or to the memory device 500 through the sixth pin P26.

In a data (DATA) output operation of the memory device 500, the controller interface circuitry 610 may generate a read enable signal nRE, which toggles, and transmit the read enable signal nRE to the memory device 500. For example, before outputting data DATA, the controller interface circuitry 610 may generate a read enable signal nRE, which is changed from a static state (e.g., a high level or a low level) to a toggling state. Thus, the memory device 500 may generate a data strobe signal DQS, which toggles, based on the read enable signal nRE. The controller interface circuitry 610 may receive the data signal DQ including the data DATA along with the data strobe signal DQS, which toggles, from the memory device 500. The controller interface circuitry 610 may obtain the data DATA from the data signal DQ based on a toggle time point of the data strobe signal DQS.

In a data (DATA) input operation of the memory device 500, the controller interface circuitry 610 may generate a data strobe signal DQS, which toggles. For example, before transmitting data DATA, the controller interface circuitry 610 may generate a data strobe signal DQS, which is changed from a static state (e.g., a high level or a low level) to a toggling state. The controller interface circuitry 610 may transmit the data signal DQ including the data DATA to the memory device 500 based on toggle time points of the data strobe signal DQS.

The controller interface circuitry 610 may receive a ready/busy output signal nR/B from the memory device 500 through the eighth pin P28. The controller interface circuitry 610 may determine state information of the memory device 500 based on the ready/busy output signal nR/B. The R/B signal of FIG. 16 may be transmitted or received through the eighth pin P28.

Figure 18:
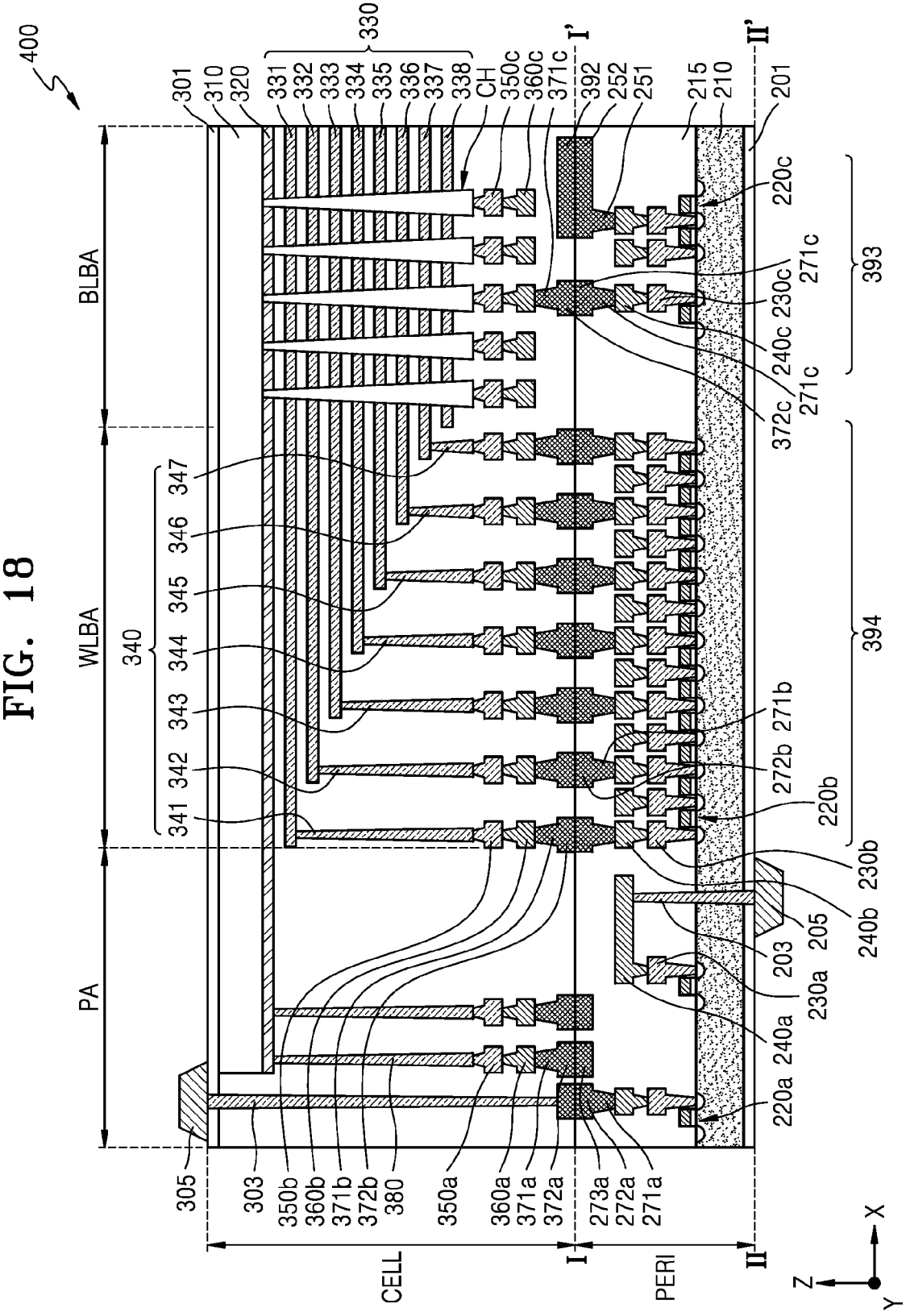
FIG. 18 is a diagram for describing a BVNAND structure applicable to a memory device, according to an example embodiment.

FIG. 18 is a diagram illustrating a memory device 400 according to another example embodiment.

Referring to FIG. 18, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 400 may include an external pad bonding area PA, a word line bonding area WLBA, and a bit line bonding area BLBA. The memory device 400 may be an example of the memory device 2 of FIG. 2. The memory cell array 32 may be formed on the cell region CELL and circuits 31, 33, 34, 35 and 36 other than the memory cell array 32 may be formed on the peripheral circuit region PERI.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrate in FIG. 18, although only the first metal layers 230a, 230b, and 230c and the second metal layers 240a, 240b, and 240c are shown and described, the example embodiment is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material, such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line formed on the second metal layer 360c may extend in a first direction (a Y-axis direction), parallel to the upper surface of the second substrate 310.

In an example embodiment illustrated in FIG. 18, an area in which the channel structure CH, the bit line formed on the second metal layer 360c, and the like are disposed may be defined as the bit line bonding area BLBA. In the bit line bonding area BLBA, the bit line formed on the second metal layer 360c may be electrically connected to the circuit elements 220c providing a page buffer 393 in the peripheral circuit region PERI. The bit line formed on the second metal layer 360c may be connected to upper bonding metals 371c and 372c in the cell region CELL, and the upper bonding metals 371c and 372c may be connected to lower bonding metals 271c and 272c connected to the circuit elements 220c of the page buffer 393. In an example embodiment, a program operation may be executed based on a page unit as write data of the page-unit is stored in the page buffer 393, and a read operation may be executed based on a sub-page unit as read data of the sub-page unit is stored in the page buffer 393. Also, in the program operation and the read operation, units of data transmitted through bit lines may be different from each other.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 850b and a second metal layer 860b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 8, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 703, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 18, an upper insulating film 301 covering the upper surface of the second substrate 310 may be formed on the second substrate 310, and a second input-output pad 305 may be disposed on the upper insulating film 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 18, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 276a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 276a formed in the uppermost metal layer of the peripheral circuit region PERI may not be connected to a contact. Similarly, in the external pad bonding area PA, an upper metal pattern 372a, corresponding to the lower metal pattern 276a formed in an uppermost metal layer of the peripheral circuit region PERI, and having the same shape as a lower metal pattern 276a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Hereinabove, example embodiments have been described in the drawings and the specification. Embodiments have been described by using the terms described herein, but this has been merely used for purposes of description and has not been used for limiting a meaning or limiting the scope of the following claims. Therefore, it may be understood by those of ordinary skill in the art that various modifications and other equivalent embodiments may be implemented. Accordingly, the spirit and scope of the embodiments may be defined based on the spirit and scope of the following claims.

Various changes in form and details may be made therein without departing from the spirit and scope of the following claims.

What is claimed is:
1. A memory system comprising:
   a memory device comprising:
      a memory cell array connected to a plurality of bit lines;
      a first latch configured to sense data stored in the memory cell array;
      a plurality of program latches configured to store data which is to be programmed in the memory cell array, or data which determines a voltage level pre-charged in the plurality of bit lines in performing a program operation; and
      a second latch configured to receive data which is to be programmed in the memory cell array, or output data sensed from the memory cell array; and
   a memory controller configured to provide a command to the memory device,
   wherein the memory device is configured to:
      sense first data from a first region of the memory cell array,
      store the first data in the first latch,
      transfer the first data from the first latch to the second latch,
      output the first data from the second latch to the memory controller, and in response to a first read command, transfer the first data from the second latch to a first program latch of the plurality of program latches.

2. The memory system of claim 1, wherein the memory controller is connected to the memory device through a pin configured to indicate a ready state or a busy state of the memory device, and wherein the pin is further configured to represent the busy state while the first data is being sensed and represent the busy state while the first data is being transferred from the second latch to the first program latch.

3. The memory system of claim 1, wherein the memory controller is further configured to, based on the first data of the first region being stored in the first program latch, output a second read command to the memory device, and wherein the second read command indicates an output of data stored in the first program latch.

4. The memory system of claim 3, wherein the memory device is further configured to:

transfer the first data stored in the first program latch to the second latch, and in response to the second read command, output the first data transferred to the second latch to the memory controller.

5. The memory system of claim 4, wherein the memory controller is connected to the memory device through a pin configured to indicate a ready state or a busy state of the memory device, and wherein the pin is configured to indicate the busy state while the first data is being transferred from the first program latch to the second latch.

6. The memory system of claim 1, wherein the memory controller is further configured to perform an error correction operation on the first data and store error correction information indicating whether correction was necessary.

7. The memory system of claim 6, wherein the memory controller comprises a read buffer configured to store data corresponding to a read command, wherein the memory controller is further configured to, based on the correction of an error not being necessary, omit a second error correction operation on the first data received from the memory device and store the first data in the read buffer, and wherein the first data is received from the memory device according to a third read command corresponding to the first region.

8. The memory system of claim 6, wherein the memory controller is further configured to store a latch table including identification numbers of the plurality of program latches, physical addresses corresponding to data stored in the plurality of program latches, and the error correction information with respect to the data stored in the plurality of program latches.

9. The memory system of claim 1, wherein the memory controller is further configured to select the first program latch from among the plurality of program latches based on a cache algorithm.

10. The memory system of claim 1, wherein the plurality of program latches comprises an upper bit latch configured to store an upper bit which is to be stored in the memory cell array and a lower bit latch configured to store a lower bit which is to be stored in the memory cell array.

11. An operating method of a memory system comprising a memory device comprising a memory cell array and a plurality of latches, and a memory controller controlling the memory device, the operating method comprising:

selecting, by the memory controller, a first latch from among the plurality of latches;

providing, by the memory controller, the memory device with a first physical address and a first read command comprising identification information about the first latch;

providing, by the memory device, the memory controller with data sensed from a region corresponding to the first physical address in the memory cell array in response to the first read command; and storing, by the memory device, the data in the first latch.

12. The operating method of claim 11, wherein the providing the memory controller with the data sensed from the region corresponding to the first physical address comprises:

sensing the data from the region corresponding to the first physical address by using a second latch of the plurality of latches;

transferring the data sensed by the second latch to a third latch of the plurality of latches; and providing the memory controller with the data transferred to the third latch.

13. The operating method of claim 11, further comprising:

providing, by the memory controller, the memory device with the first physical address and a second read command comprising information about the first latch; and providing, by the memory device, the memory controller with data stored in the first latch, in response to the second read command.

14. The operating method of claim 11, wherein the selecting the first latch from among the plurality of latches comprises selecting the first latch from among the plurality of latches by using a cache algorithm.

15. The operating method of claim 11, further comprising performing, by the memory controller, an error correction operation on the data received from the memory device and storing error correction information indicating whether correction was necessary.

16. The operating method of claim 15, further comprising:

providing, by the memory controller, the memory device with the first physical address and a third read command including information about the first latch; and providing, by the memory device, the memory controller with data stored in the first latch, in response to the third read command, wherein the memory controller is configured to omit an error correction of data received based on the third read command.

17. A memory device comprising:

a memory cell array connected to a plurality of bit lines;

a first latch configured to sense data stored in the memory cell array;

a second latch configured to store data which is to be programmed in the memory cell array, or data determining a voltage level pre-charged in the plurality of bit lines in performing a program operation; and a third latch configured to receive data which is to be programmed in the memory cell array, or output data sensed from the memory cell array, wherein, in response to a first read command corresponding to a first region of the memory cell array, the first latch is configured to sense first data from the first region and transfer the first data to the third latch, and the third latch is configured to output the first data to a memory controller and transfer the first data to the second latch.

18. The memory device of claim 17, further comprising a pin configured to indicate a ready state or a busy state of the memory device,
  wherein the pin is configured to indicate the busy state while the first latch is sensing the first data and represent the busy state while the first data is being transferred to the second latch.

19. The memory device of claim 17, wherein, in response to a second read command corresponding to the first region, the second latch is configured to transfer the first data to the third latch, and the third latch is configured to output the first data to the memory controller.

20. The memory device of claim 19, further comprising a pin configured to indicate a ready state or a busy state of the memory device,
  wherein the pin is configured to represent the busy state while the second latch is transferring the first data to the third latch.

* * * * *